United States Patent
Kim et al.

(10) Patent No.: US 10,685,202 B2
(45) Date of Patent: Jun. 16, 2020

(54) DISPLAY DEVICE AND OPERATING METHOD THEREOF

(71) Applicant: Samsung Display Co., Ltd., Yongin-si, Gyeonggi-do (KR)

(72) Inventors: Do Ik Kim, Yongin-si (KR); Young Sik Kim, Yongin-si (KR); In Young Han, Yongin-si (KR)

(73) Assignee: SAMSUNG DISPLAY CO., LTD. (KR)

(*) Notice: Subject to any disclaimer, the term of this patent is extended or adjusted under 35 U.S.C. 154(b) by 133 days.

(21) Appl. No.: 15/677,699

(22) Filed: Aug. 15, 2017

(65) Prior Publication Data
US 2018/0089491 A1 Mar. 29, 2018

(30) Foreign Application Priority Data
Sep. 26, 2016 (KR) .................. 10-2016-0123460

(51) Int. Cl.

| | | |
|---|---|---|
| *G06K 9/00* | (2006.01) | |
| *H01L 27/32* | (2006.01) | |
| *G09G 3/3233* | (2016.01) | |
| *F21V 8/00* | (2006.01) | |
| *G06F 3/041* | (2006.01) | |
| *H01L 27/15* | (2006.01) | |

(52) U.S. Cl.
CPC ....... *G06K 9/00006* (2013.01); *G02B 6/0088* (2013.01); *G06F 3/0412* (2013.01); *G06K 9/0004* (2013.01); *G06K 9/00912* (2013.01); *G09G 3/3233* (2013.01); *H01L 27/3225* (2013.01); *H01L 27/15* (2013.01)

(58) Field of Classification Search
CPC .............. G06K 9/00; G06K 19/0718; G06K 19/07354; G06F 17/3074; G06F 17/30784; G06F 21/32
See application file for complete search history.

(56) References Cited

U.S. PATENT DOCUMENTS 10,410,033 B2 * 9/2019 He .................. G06K 9/0012
2004/0263069 A1 12/2004 Yamazaki et al.
(Continued)

FOREIGN PATENT DOCUMENTS

| EP | 2369404 A1 | 9/2011 |
|---|---|---|
| KR | 10-1349924 B1 | 1/2014 |

(Continued)

OTHER PUBLICATIONS

European Search Report, Application No. 17192849.2, dated Mar. 8, 2018, pp. 1-17.
(Continued)

*Primary Examiner* — Bobbak Safaipour
(74) *Attorney, Agent, or Firm* — Innovation Counsel LLP

(57) ABSTRACT

A display device includes a first substrate having light transmitting portions, a plurality of pixels positioned on the first substrate and including light emitting devices, a light sensor layer overlapping the first substrate and including light receiving devices respectively corresponding to the light transmitting portions, and a light guide layer positioned between the display panel and the light sensor layer and including light guide paths respectively corresponding to the light transmitting portions.

27 Claims, 14 Drawing Sheets

(56) References Cited

U.S. PATENT DOCUMENTS

| | | | |
|---|---|---|---|
| 2007/0045513 A1 | 3/2007 | Lee et al. | |
| 2007/0109239 A1 | 5/2007 | den Boer et al. | |
| 2007/0152555 A1* | 7/2007 | Park | H01J 11/44 |
| | | | 313/112 |
| 2008/0121442 A1 | 5/2008 | Boer et al. | |
| 2013/0163063 A1* | 6/2013 | Cho | G02B 26/02 |
| | | | 359/230 |
| 2015/0226988 A1* | 8/2015 | Chen | G02F 1/1334 |
| | | | 349/12 |
| 2015/0348504 A1 | 12/2015 | Sakariya et al. | |
| 2016/0232397 A1 | 7/2016 | Yu et al. | |
| 2016/0224816 A1 | 8/2016 | Smith et al. | |
| 2016/0266695 A1 | 9/2016 | Bae et al. | |
| 2017/0068052 A1* | 3/2017 | Amoah | G02B 6/30 |
| 2017/0249494 A1* | 8/2017 | Zhang | G06K 9/00013 |
| 2017/0263895 A1* | 9/2017 | Lee | H01L 27/3246 |
| 2017/0343719 A1* | 11/2017 | Lo | G02B 6/0055 |
| 2018/0005005 A1* | 1/2018 | He | G06F 21/83 |
| 2018/0006072 A1* | 1/2018 | Roy | H01L 27/14629 |

FOREIGN PATENT DOCUMENTS

| | | |
|---|---|---|
| KR | 10-1407936 B1 | 6/2014 |
| WO | 2014198259 A1 | 12/2014 |
| WO | 2015108477 A1 | 7/2015 |

OTHER PUBLICATIONS

European Search Report, Application No. 17192849.2, dated Jun. 29, 2018, pp. 1-22.

\* cited by examiner

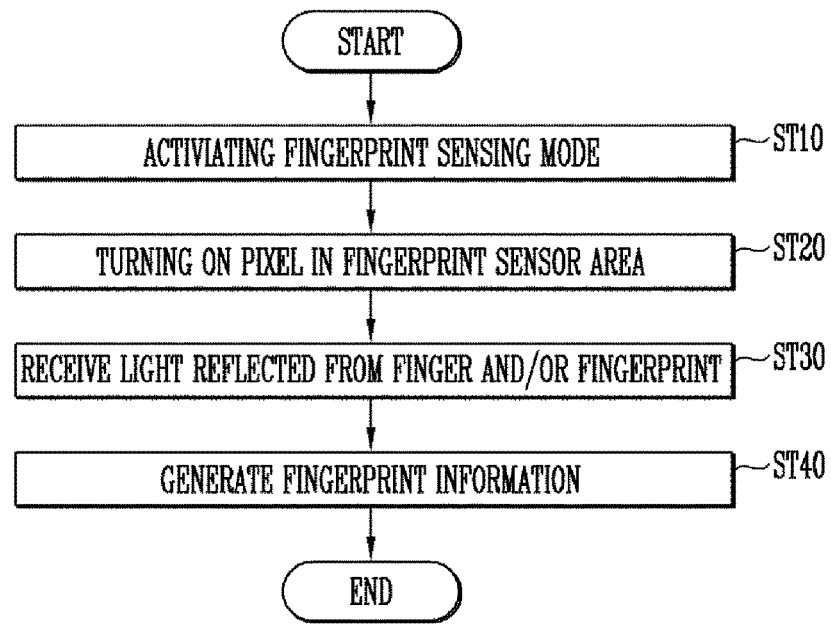
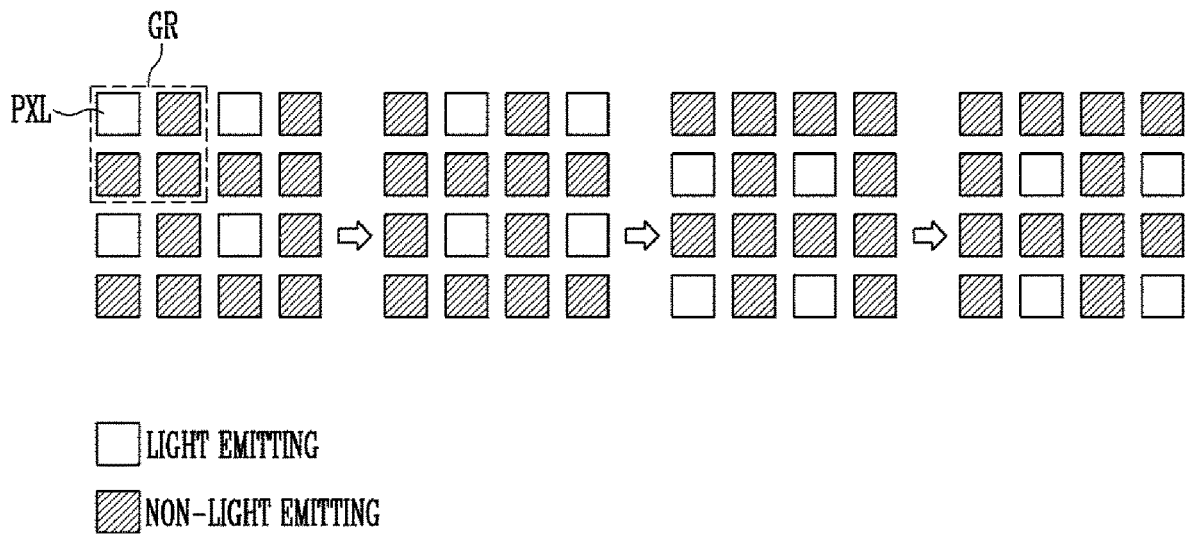

DISPLAY DEVICE AND OPERATING METHOD THEREOF

RELATED APPLICATION(S)

The present application claims priority under 35 U.S.C. 119(a) to Korean Patent Application No. 10-2016-0123460, filed on Sep. 26, 2016, in the Korean Intellectual Property Office; the entire contents of the Korean Patent Application are incorporated herein by reference.

BACKGROUND

1. Field

Embodiments relate to a display device and a method of operating the display device.

2. Description of the Related Art

A display device may have a fingerprint sensing function. In the display device, a fingerprint sensor may be attached to a predetermined area of a display panel.

The fingerprint sensor may include, for example, a light source, a lens, and an image sensor. The fingerprint sensor may significantly add to the thickness and the manufacturing cost of the display device.

SUMMARY

According to an embodiment, a display device may have a fingerprint sensor without requiring an additional light source and may display image with satisfactory quality. An embodiment may be related to a driving/operating method of the display device.

According to an embodiment, a display device may include a display panel including a first substrate and a plurality of pixels (the pixels being positioned on the first substrate and including light emitting devices), a light sensor layer on the first substrate and including a plurality of light receiving devices corresponding to light transmitting paths between the plurality of pixels, and a light guide layer between the display panel and the light sensor layer and including a plurality of light guide paths corresponding to the light transmitting paths.

According to an embodiment, the pixels may be on a first surface of the first substrate, and the light sensor layer may be on a second surface of the first substrate.

The pixels may emit light in an upward direction relative to the first substrate, and each of the light transmitting paths and each of the light guide paths may transmit reflected light, which may be a portion of light emitted from at least one pixel and reflected by a user finger.

A Longitudinal direction of the light transmitting paths and the light guide paths may be perpendicular to a plane in which the display panel is displayed.

A fingerprint sensor unit may be provided in the display device. The fingerprint sensor unit may include at least one light transmitting path, at least one light receiving device, and at least one light guide path arranged to be overlapped with one another, among the light transmitting paths, the light guide paths, and the light receiving devices.

A plurality of fingerprint sensor units may be arranged in an array form in a predetermined fingerprint sensor area.

The fingerprint sensor area may be arranged in at least one area of an active area in which the pixels are arranged.

At least one area of the fingerprint sensor unit may overlap at least one pixel.

The fingerprint sensor unit may overlap a boundary between immediately neighboring pixels.

The light transmitting paths may be arranged in peripheries of light emitting devices included in at least a portion of the pixels.

The light transmitting paths may be arranged in spaces between light shielding wires and circuit devices included in an active area in which the pixels are arranged.

The light guide layer may be a light shielding layer including a plurality of openings constituting the light guide paths.

The light guide layer may further include color filers filling the openings.

The light guide layer may include optical fibers constituting the light guide paths.

The light guide layer may further include a transparent insulating layer having a smaller refractive index than optical fibers and filling spaces between the optical fibers.

The optical fibers may include color filter materials included in a core.

The display device may further include a filter layer arranged between the display panel and the light guide layer.

Each of the pixels may include a plurality of sub-pixels emitting light in different colors, and the filter layer may be a color filter selectively transmitting light emitted from a portion of the plurality of sub-pixels.

Each of the light receiving devices may generate an output signal corresponding to light incident through each of the light transmitting paths and each of the light guide paths.

A fingerprint shape on the display panel may be sensed by using output signals from the light receiving devices.

The display device may further include a touch sensor layer arranged in at least one area of an active area in which the pixels are arranged.

The touch sensor layer may include at least one touch sensor electrode arranged in a predetermined sensor area in which the light transmitting paths, the light receiving devices and the light guide paths are arranged.

Pixels in a fingerprint sensor area including the light sensor layer may selectively emit light in response to a control signal corresponding to a fingerprint sensing mode.

The pixels in the fingerprint sensor area may be divided into the plurality of pixels to form a plurality of groups, and the plurality of pixels included in each group may sequentially emit light in response to the control signal.

According to an embodiment, a method may be used for driving/operating a display device. The display device may include a display panel including a plurality of pixels having light emitting devices for displaying an image in an active area, a light sensor layer arranged in a fingerprint sensor area positioned in the active area, and a light guide layer between the display panel and the light sensor layer. The method includes activating a fingerprint sensing mode in response to a control signal, turning on at least a portion of pixels arranged in the fingerprint sensor area, receiving light reflected from a fingerprint and/or a finger of a user, the light being received by the light sensor layer after being transmitted via the light guide layer, generating an output signal corresponding to received light, and generating fingerprint information using the output signal.

In the turning on of the at least the portion of the pixels arranged in the fingerprint sensor area, the pixels in the fingerprint sensor area may be divided into a plurality of groups, and pixels included in each group may sequentially emit light.

In the turning on of the at least a portion of the pixels arranged in the fingerprint sensor area, a fingerprint sensing period during which the fingerprint sensing mode is activated may be divided into a plurality of sub-periods, and a portion of pixels arranged with a predetermined distance among the pixels in the fingerprint sensor area may emit light during each sub-period.

The display device may further include a touch sensor layer arranged in at least the fingerprint sensor area and generates the control signal corresponding to a touch signal from the touch sensor layer.

The touch sensor layer, the light sensor layer, and the light guide layer may be arranged in an entire active area, and an area in which the touch signal is generated may be set to the fingerprint sensor area.

The fingerprint sensor area may be displayed by concurrently turning on at least a portion of pixels in the area in which the touch signal is generated.

The fingerprint sensor area may be displayed by concurrently turning on at least a portion of pixels in the fingerprint sensor area during an initial period of a fingerprint sensing period during which the fingerprint sensing mode is activated.

An embodiment may be related to a display device. The display device may include a first substrate having light transmitting portions, a plurality of pixels positioned on the first substrate and including light emitting devices, a light sensor layer overlapping the first substrate and including a light receiving devices respectively corresponding to the light transmitting portions for outputting one or more output signals in response to received light, and a light guide layer positioned between the display panel and the light sensor layer and including light guide paths. The light guide paths may respectively correspond to the light transmitting portions. The light guide paths may be respectively connected to and/or aligned with the light transmitting portions.

The first substrate may be positioned between the plurality of pixels and the light sensor layer.

The display device may include a second substrate, which may overlap the first substrate and may include light transmitting parts. The light transmitting parts respectively correspond to (and are respectively aligned with) the light transmitting portions. The pixels may emit light toward the second substrate and may be positioned between the first substrate and the second substrate.

A longitudinal direction of each of the light transmitting portions and a longitudinal direction of each of the light guide paths may be perpendicular to a face of the first substrate on which the plurality of pixels is arranged.

The display device may include a plurality of fingerprint sensor units including a first fingerprint sensor unit. The first fingerprint sensor unit may include a first light transmitting portion among the light transmitting portions, a first light receiving device among the light receiving devices, and a first light guide path among the light guide paths. The first light transmitting portion, the first light receiving device, and the first light guide path may correspond to (and may be aligned with) one another.

The pixels include a first pixel. The first pixel may include two subpixels immediately neighboring each other. A geometric axis of the first light guide path may coincide with a boundary between the two subpixels.

In a predetermined portion of the display device a total quantity of the fingerprint sensors may be equal to a total quantity of the pixels or may be equal to a fraction of the total quantity of the pixels.

The first fingerprint sensor unit may overlap at least one of the pixels.

The pixels include a first pixel. The first pixel may include two subpixels immediately neighboring each other. The first light receiving device may be positioned at a boundary between the two subpixels.

The light guide paths include a first light guide path. The pixels include a first pixel. The first pixel may include a first subpixel and a second subpixel immediately neighboring each other. The first light guide path may be positioned between a light emitting device of the first subpixel and a transistor of the second subpixel (e.g., in a plan view of the display device).

The first light guide path may be positioned between a first electrode of the light emitting device of the first pixel and an active layer of the transistor of the second pixel (e.g., in a plan view of the display device).

The light guide paths may be openings, through holes, or transparent portions of the light guide layer. The light guide layer may include light shielding portions positioned between the light guide paths.

The light guide paths may include color filters. The light guide layer may include light shielding portions positioned between the color filers.

The light guide paths may include optical fibers.

The light guide layer further may include transparent insulating portions positioned between the optical fibers. A refractive index of each of the transparent insulating portions may be less than a refractive index of each of the optical fibers.

A core of each of the optical fibers may include a color filter material.

The display device may include a color filter layer positioned between the first substrate and the light guide layer. Each of the pixels may include a plurality of sub-pixels emitting light in different colors. The different colors include a first color. The color filter layer may have the first color.

The light guide paths include a first light guide path, which may include a first cladding and a first core surrounded by the first cladding. The light guide layer may include an insulating portion surrounding the first cladding. A refractive index of the first core may be greater than a refractive index of the first cladding. The refractive index of the first cladding may be greater than a refractive index of the insulating portion.

The light guide paths include a first light guide path. The pixels include a first pixel. The first pixel may include a first subpixel and a second subpixel immediately neighboring each other. The first light guide path may be positioned between a light emitting device of the first subpixel and a light emitting device of the second subpixel (e.g., in a plan view of the display device).

The display device may include a touch sensor layer, which may include touch sensor electrodes. The touch sensor electrodes may respectively overlap the pixels and may respectively overlap the light guide paths.

The touch sensor electrodes include a first touch sensor electrode. The light guide paths include a first light guide path overlapping the first touch sensor electrode and positioned between a first edge of the first touch sensor electrode and a second edge of the first touch sensor electrode. A minimum distance between the first edge of the first touch sensor electrode and the first light guide path may be greater than a minimum distance between the second edge of the first touch electrode and the first light guide path.

A first subset of the pixels may emit light in response to a control signal to indicate a fingerprint sensing area when a second subset of the pixels emits no light. Pixels of the second subset may be positioned between pixels of the first subset and may separate the pixels of the first subset from one another.

The pixels may form a plurality of pixel groups. Pixels included in one/each of the pixel groups may sequentially emit light in response to a control signal.

An embodiment may be related to a method of operating a display device. The display device may include a first substrate, a plurality of pixels positioned on the first substrate and having light emitting devices, a light sensor layer overlapping the first substrate, and a light guide layer positioned between the first substrate and the light sensor layer. The method may include the following steps: starting a fingerprint sensing period in response to a control signal; turning on a first subset of the pixels during the fingerprint sensing period to emit first light toward at least one of a finger and a fingerprint; receiving second light using the light sensor layer. The second light may be a portion of the first light that may be reflected from the at least one of the finger and the fingerprint and may be transmitted via the light guide layer; generating an output signal corresponding to the second light; and generating fingerprint information using the output signal.

The method may include turning off or keeping off a second subset of the pixels when the first subset of the pixels is on. Pixels of the second subset may be positioned between pixels of the first subset and may separate the pixels of the first subset from one another.

The fingerprint sensing period may include a first sub-period and a second sub-period immediately following the first sub-period. The first subset of the pixels may emit the first light in the first sub-period. A second subset of the pixels may emit no light in the first sub-period. The first subset of the pixels may emit no light in the second sub-period. The second subset of the pixels may emit third light in the second sub-period.

The method may include generating the control signal in response to a touch provided by the finger on the display device.

The method may include the following steps: setting a fingerprint sensing area based on a location of the touch; and selecting the first subset of the pixels based on the fingerprint sensing area.

The method may include indicating, in response to the touch, the fingerprint sensing area by concurrently turning on at least pixels that are located in an area of the display device corresponding to the touch.

The method may include indicating a fingerprint sensing area by concurrently turning on the first subset of the pixels for a predetermined initial period of the fingerprint sensing period. The first subset of the pixels may be located in the fingerprint sensing area.

BRIEF DESCRIPTION OF THE DRAWINGS

FIG. 20 is a flowchart illustrating a driving/operating method of a display device according to an embodiment.

FIG. 21 illustrates a driving method of pixels in a fingerprint sensing area according to an embodiment.

DETAILED DESCRIPTION

Embodiments are described with reference to the accompanying drawings. Practical embodiments are not limited to the embodiments described below, but may be modified into various forms.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Figure 1:
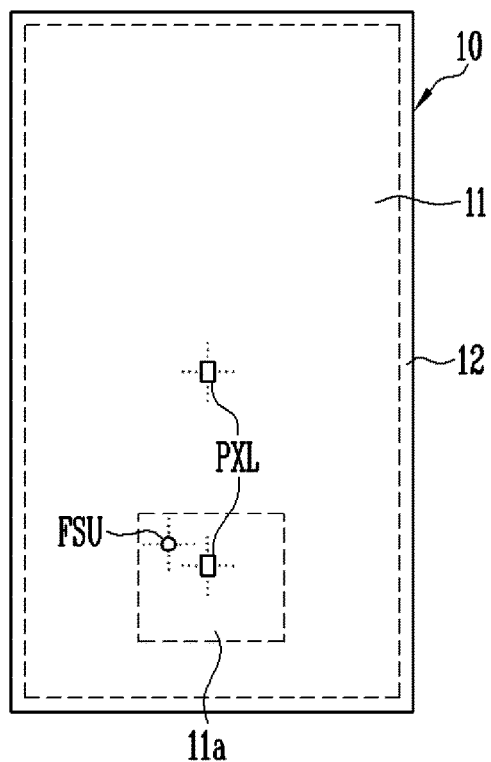
FIG. 1 illustrates a plan view of a display device according to an embodiment.
Figure 2:
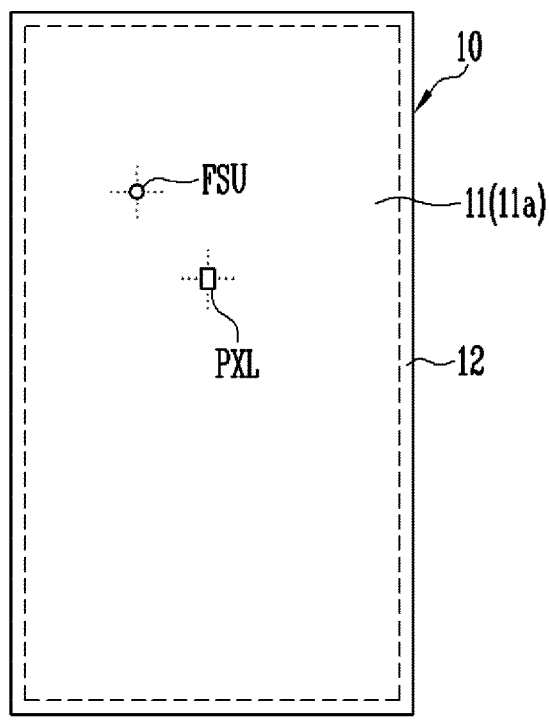
FIG. 2 illustrates a plan view of a display device according to an embodiment.

FIGS. 1 and 2 illustrate a display device according to an embodiment. FIGS. 1 and 2 schematically show a display panel provided in a display device according to an embodiment, and fingerprint sensor units disposed in at least one area of the display panel.

Referring to FIGS. 1 and 2, the display device according to an embodiment may comprise a display panel 10 including an active area 11 and a non-active area 12.

A plurality of pixels PXL may be arranged in the active area 11. According to an embodiment, each of the pixels PXL may include at least one light emitting element. The display device may display an image in the active area 11 by driving the pixels PXL in response to input image data. In an embodiment, the active area 11 may be an effective display area of the display device.

According to an embodiment, a fingerprint sensor area 11a may be disposed in the active area 11. In an embodiment, the fingerprint sensor area 11a may be disposed in at least one area of the active area 11. For example, the fingerprint sensor area 11a may be disposed only in a portion of the active area 11 as shown in FIG. 1.

According to an embodiment, the fingerprint sensor area 11a may be disposed in substantially the same area as the active area 11 as shown in FIG. 2. According to an embodiment, the active area 11 and the fingerprint sensor area 11a may coincide with each other. In this case, a fingerprint sensing function may be provided or activated in the entire active area 11.

A plurality of fingerprint sensor units FSU may be disposed in the fingerprint sensor area 11a. The fingerprint sensor units FSU may constitute a fingerprint sensor.

According to an embodiment, each of the fingerprint sensor units FSU may use a light emitting device provided in at least one pixel PXL in a periphery of the fingerprint sensor units FSU as a light source for fingerprint sensing. To this end, the fingerprint sensor units FSU may be disposed to be adjacent to at least one pixel PXL, or at least one area of the fingerprint sensor units FSU may overlap the at least one pixel PXL.

The non-active area 12 (or non-displaying area 12) may be arranged in a periphery of the active area 11. The non-active area 12 may be the remaining area, except for the active area 11. The non-active area 12 may not be provided with the pixel PXL. In an embodiment, the non-active area 12 may be a non-image-display area. According to an embodiment, the non-active area 12 may include a wire routing area, a pad area, and/or various dummy areas.

According embodiments, the fingerprint sensor area 11a having a plurality of fingerprint sensor units FSU may be provided in the active area 11. As a result, the fingerprint sensing function may be provided in the active area 11. In an embodiment, in the display device, the fingerprint sensor may sense a fingerprint of a user sing light emitted from the pixels PXL without requiring an additional light source. Accordingly, the display device with a fingerprint sensing function may have a minimum thickness, and the manufacturing cost of the display device may be minimized.

Figure 3:
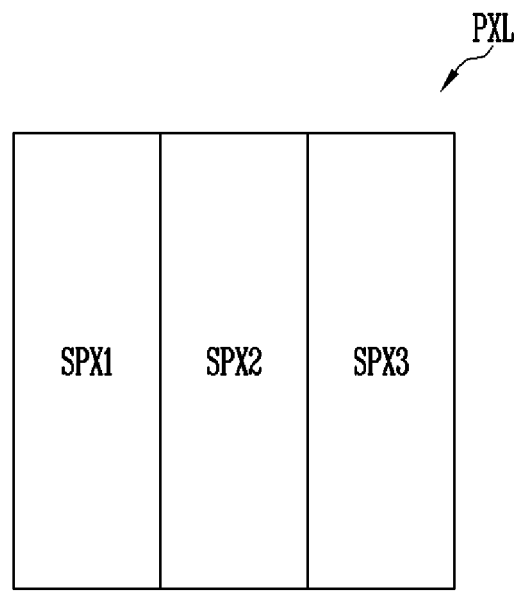
FIG. 3 illustrates a plan view of a pixel according to an embodiment.

FIG. 3 illustrates a pixel according to an embodiment. In an embodiment, FIG. 3 shows an example of a pixel provided in a stripe-type display device and consisting of three sub-pixels. The shape and the arrangement structure of the pixels and/or the number of sub-pixels may be optimized and/or configured according to particular embodiments. For example, an embodiment may be applied to a Pen-tile type display device.

Referring to FIG. 3, the pixel PXL may include a plurality of sub-pixels SPX1, SPX2, and SPX3. For example, the pixel PXL may include first, second and third sub-pixels SPX1, SPX2, and SPX3 that emit light in different colors.

According to an embodiment, the first sub-pixel SPX1, the second sub-pixel SPX2 and the third sub-pixel SPX3 may be a red sub-pixel, a green sub-pixel, and a blue sub-pixel that emit red, green and blue light, respectively. The pixel PXL may emit light of various colors using the plurality of sub-pixels SPX1, SPX2, and SPX3 that emit light in different colors.

Figure 4:
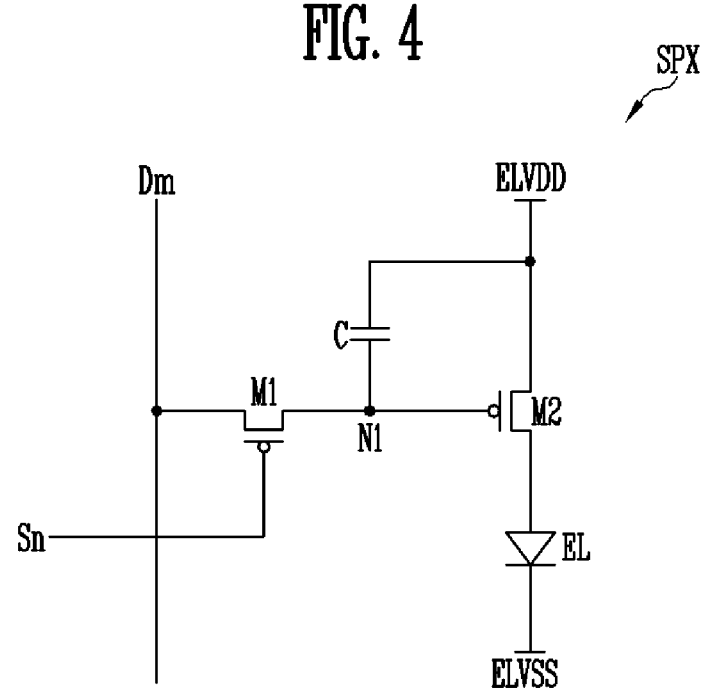
FIG. 4 is a circuit view/diagram illustrating a sub-pixel according to an embodiment.

FIG. 4 is a circuit view illustrating a sub-pixel according to an embodiment. In an embodiment, FIG. 4 shows an active type sub-pixel connected to an nth (n is a natural number) scan line and an mth (m is a natural number) data line and including two transistors.

Referring to FIG. 4, a sub-pixel SPX according to an embodiment may include first and second transistors M1 and M2, a capacitor C, and a light-emitting device EL.

The first transistor M1 may be connected between a data line Dm and a first node N1 and a gate electrode of the first transistor M1 may be connected to a scan line Sn. The first transistor M1 may be turned on when a scan signal having a gate-on voltage (e.g., a low voltage) is supplied from the scan line Sn. When the first transistor M1 is turned on, the data line Dm and the first node N1 may be electrically connected.

The second transistor M2 may be connected between a first power source ELVDD and the light emitting device EL and a gate electrode of the second transistor M2 may be connected to the first node N1. The second transistor M2 may control a driving current supplied from the first power source ELVDD to a second power source ELVSS via the light emitting device EL corresponding to a voltage of the first node N1. According to an embodiment, the first power source ELVDD may be a high potential pixel power source and the second power source ELVSS may be a low potential pixel power source.

The capacitor C may be connected between the first power source ELVDD and the first node N1. The capacitor C may store a voltage corresponding to a data signal supplied to the first node N1 and maintain the stored voltage until a data signal of a subsequent frame is supplied.

The light emitting device EL may be connected between the second transistor M2 and the second power source ELVSS. The light emitting device EL may emit light of brightness corresponding to the driving current controlled by the second transistor M2. According to an embodiment, the light emitting device EL may be an organic light emitting diode (OLED).

Figure 5:
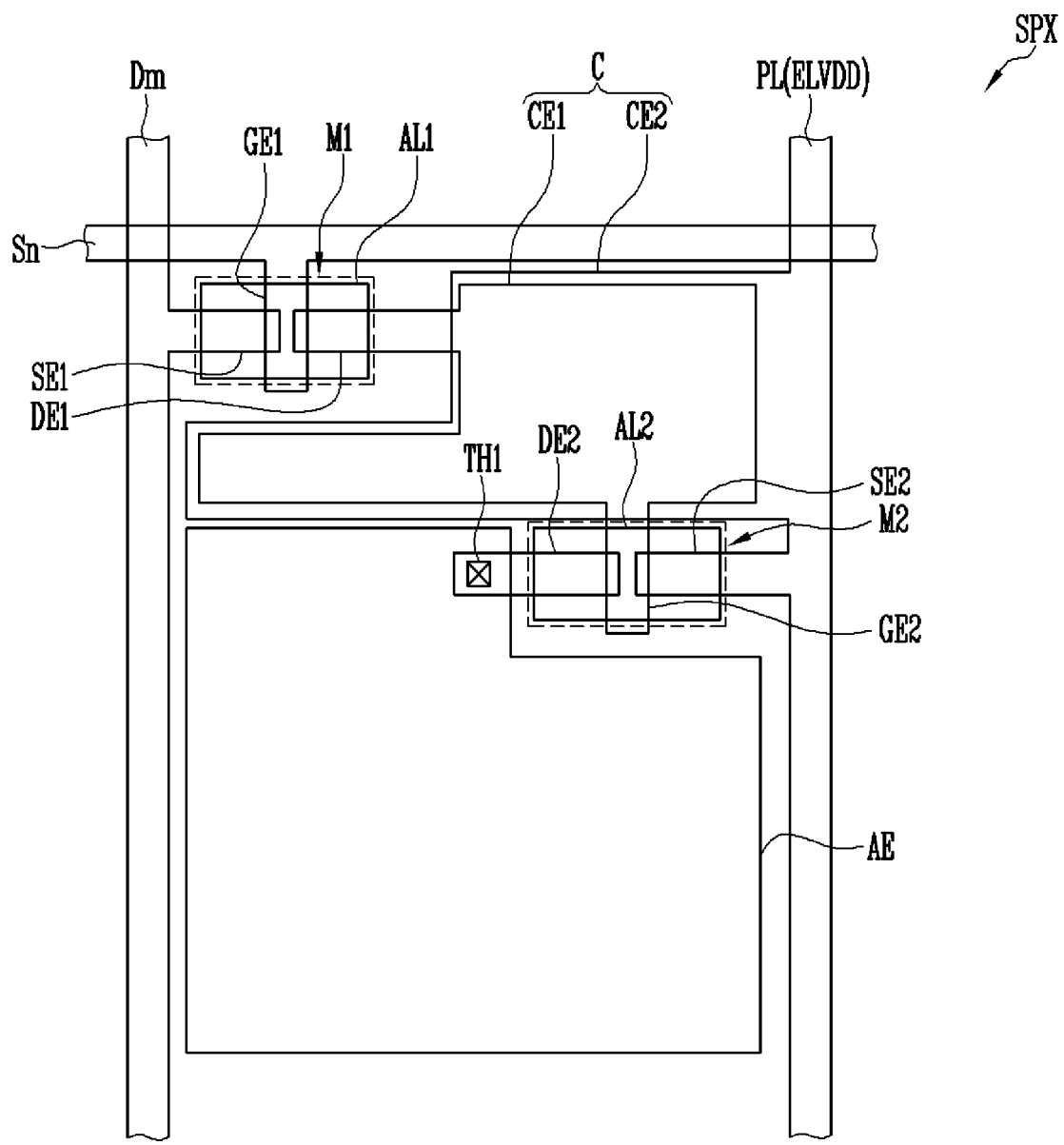
FIG. 5 illustrates an embodiment of a layout of the sub-pixel shown in FIG. 4.

FIG. 5 illustrates an embodiment of a layout of the sub-pixel shown in FIG. 4. However, a layout shape of the sub-pixel may be optimized and/or configured in particular embodiments.

Referring to FIG. 5, the first transistor M1 may include a gate electrode GE1 connected to the scan line Sn, an active layer AL1 overlapping the gate electrode GE1, a source electrode SE1 contacted with the active layer AL1 and connected to the data line Dm, and a drain electrode DE1 contacted with the active layer AL1 and connected to a first electrode CE1 of the capacitor C. The source electrode SE1 and the drain electrode DE1 of the first transistor M1 may be switched with each other according to the type of the first transistor M1 and/or the direction of a voltage applied to the first transistor M1.

The capacitor C may include the first electrode CE1 connected to the drain electrode DE1 of the first transistor M1 and a gate electrode of the second transistor M2 and a second electrode CE2 overlapping the first electrode CE1 and connected to a power source line PL to which the first power source ELVDD is applied.

The second transistor M2 may include a gate electrode GE2 connected to the first electrode CE1 of the capacitor C, an active layer AL2 overlapping a gate electrode GE2, a source electrode SE2 contacted with the active layer AL2 and connected to the power source line PL to which the first power source ELVDD is applied, and a drain electrode DE2 contacted with the active layer AL2 and connected to a first electrode of the light emitting device EL, for example, an anode electrode AE. The source electrode SE2 and the drain electrode DE2 of the second transistor M2 may be switched with each other according to the type of the second transistor M2 and/or the direction of a voltage applied to the second transistor M2.

The anode electrode AE may be electrically connected to the drain electrode DE2 of the second transistor M2 through a via hole TH1. In FIG. 5, the anode electrode AE is illustrated not to overlap the first and second transistors M1 and M2 and the capacitor C. In an embodiment, the anode electrode AE may be insulated from the transistors M1 and M2 and the capacitor C and may overlap at least one of the transistors M1 and M2 and the capacitor C. For example, in a top light emitting type display device, the anode electrode AE may overlap with at least one of the first and second transistors M1 and M2 and the capacitor C.

A light emitting layer and a cathode electrode which are not shown may be further disposed on the anode electrode AE. According to an embodiment, in the top light emitting type display device, the cathode electrode may be embodied as a transparent electrode so that light generated in a light emitting layer may be transmitted.

Referring to an example of a layout of FIG. 5, a space in which a light shielding element is not arranged may be included between circuit elements (for example, the first and second transistors M1 and M2, and the capacitor C) constituting the sub-pixel SPX and/or wires (for example, the scan line Sn, the data line Dm, and the power source line PL). In an embodiment, there is a space in which the light shielding element is not disposed between adjacent sub-pixels SPX. In an embodiment, a plurality of spaces in which light is transmitted may be provided in the active area 11, and each of the spaces may constitute a light transmitting path.

Figure 6:
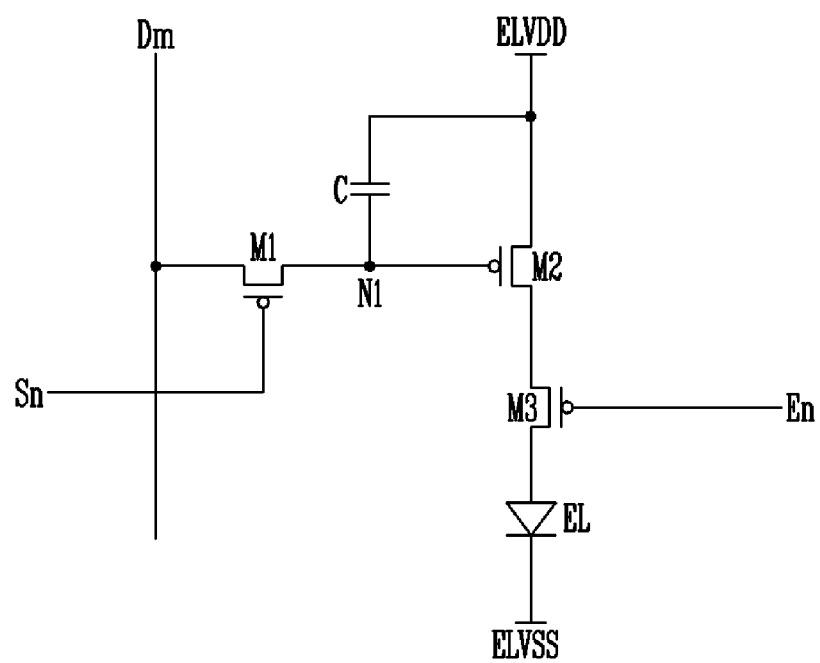
FIG. 6 is a circuit view/diagram illustrating a sub-pixel according to an embodiment.

FIG. 6 is a circuit view illustrating a sub-pixel according to an embodiment. In FIG. 6, the similar or same elements as in FIG. 4 are denoted by the same reference numerals.

Referring to FIG. 6, the sub-pixel SPX according to an embodiment may further include a third transistor M3. The third transistor M3 may be connected between the second transistor M2 and the light emitting device EL and a gate electrode of the third transistor M3 may be connected to a light emitting control line En. The third transistor M3 may be turned on or off in response to a light emitting control signal supplied from the light emitting control line En. According to an embodiment, the light emitting control signal may have a gate-off voltage (e.g., a high voltage) that turn off the third transistor M3. In such a case, the third transistor M3 may be turned off when the light emitting control signal is supplied to the light emitting control line En, and in other cases, the third transistor M3 may be turned on when a voltage of the light emitting control signal is set to the gate-on voltage.

When the third transistor M3 is turned on, the second transistor M2 and the light emitting device EL may be electrically connected to each other. Accordingly, a current path from the first power source ELVDD to the second power source ELVSS may be formed via the second transistor M2, the third transistor M3 and the light emitting device EL.

In embodiments, in FIGS. 4 to 6, a relatively small number of transistors, for example, active type sub-pixels SPX having a simple structure including the first, second and/or third transistors M1, M2 and M3 and one capacitor C are shown as examples. In an embodiment, the structures of the sub-pixels SPX and/or the pixels PXL may be different from the structures discussed above.

For example, each sub-pixel SPX may further include one or more transistors which are not shown in addition to the first, second, and third transistors M1, M2, and M3. For example, each sub-pixel SPX may further include at least one of a fourth transistor for diode-connecting the driving transistor for compensating a threshold voltage of the driving transistor (i.e., the second transistor M2), a fifth transistor for initializing a gate voltage of the driving transistor (i.e., a voltage of the first node N1), a sixth transistor for controlling the connection between the first power source ELVDD and the driving transistor, and a seventh transistor for initializing an anode voltage of the light emitting device EL. In an embodiment, as the pixel structure is changed, the position of the capacitor C may be changed, or at least one capacitor (not shown) in addition to the capacitor C may be additionally provided in each sub-pixel SPX.

Figure 7:
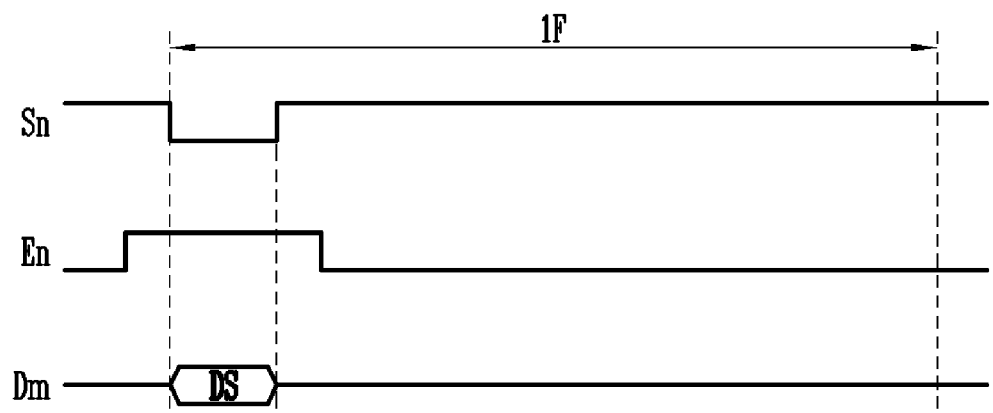
FIG. 7 is a waveform view/diagram illustrating an embodiment of a driving method of the sub-pixel shown in FIG. 6.

FIG. 7 is a waveform view illustrating an embodiment of a driving method of the sub-pixel shown in FIG. 6.

Referring to FIG. 7, the light emitting control signal of the gate-off voltage (for example, a high voltage) may be supplied to the light emitting control line En before a scan signal of the gate-on voltage (for example, a low voltage) is supplied to the scan line Sn. The light emitting control signal may be supplied for at least a period during which the scan signal is supplied and the light emitting control signal is not supplied after the supply of the scan signal is stopped. In an embodiment, the voltage of the light emitting control signal may be changed to the gate-on voltage (for example, a low voltage) after the supply of the scan signal is completed and the voltage of the scan line Sn is changed to the gate-off voltage (for example, a high voltage). When the light emitting control signal of the gate-off voltage is supplied to the light emitting control line En, the third transistor M3 may be turned off. As a result, the driving current to the light emitting device EL may not be supplied.

In a period during which the light emitting control signal is supplied to the light emitting control line En, the scan signal of the gate-on voltage may be supplied to the scan line Sn. When the scan signal is supplied to the scan line Sn, the first transistor M1 may be turned on and the data line Dm and the first node N1 may be electrically connected. Thus, a data signal DS from the data line Dm may be supplied to the first node N1. A voltage corresponding to the data signal DS, for example, a difference voltage between the first power source ELVDD and the data signal DS may be stored in the capacitor C.

After a voltage corresponding to the data signal DS is stored or charged in the capacitor C, the supply of the light emitting control signal may be stopped. In an embodiment, after the data signal DS is stored in the sub-pixel SPX, the voltage of the light emitting control signal may be changed to the gate-on voltage. Thus, the third transistor M3 may be turned. When the third transistor M3 is turned on, the second transistor M2 and the light emitting device EL may be electrically connected to each other. Accordingly, a current path of a driving current from the first power source ELVDD to the second power source ELVSS via the second transistor M2, the third transistor M3 and the light emitting device EL may be formed. The second transistor M2 may control the amount of the driving current corresponding to the voltage of the first node N1, and the light emitting device EL may emit light of a brightness corresponding to the amount of the driving current. When the data signal DS corresponding to a black grayscale is supplied during the period during which the scan signal is supplied, the second transistor M2 may block the driving current from flowing to the light emitting device EL. Accordingly, the light emitting device EL may emit no light during a first frame (1F) to express the black grayscale.

The sub-pixel SPX described above may control the amount of driving current by the second transistor M2 and control the formation of the current path by the third transistor M3. Therefore, when at least one pixel PXL disposed in a predetermined area (for example, the fingerprint sensor area 11a) emits light during a predetermined period (for example, a fingerprint sensing period), the emission of the pixel PXL may be easily controlled by using the scan signal and/or the data signal together with the light emitting control signal.

FIGS. 8 to 12 illustrate a fingerprint sensor area of a display device according to embodiments.

Referring to FIGS. 8 to 12, the fingerprint sensor may include the plurality of fingerprint sensor units FSU distributed in the fingerprint sensor area 11a. As described in FIGS. 1 and 2, the fingerprint sensor area 11a may be a portion of the active area 11, or an entire area of the active area 11.

According to an embodiment, a plurality of fingerprint sensor units FSU may be regularly arranged in the fingerprint sensor area 11a. According to an embodiment, the fingerprint sensor units FSU may be distributed irregularly in the fingerprint sensor area 11a.

According to an embodiment, each of the fingerprint sensor units FSU may use the light emitting device EL provided in at least one pixel PXL, for example, one or more light emitting devices EL included in the first to third sub-pixels SPX1, SPX2 and SPX3 may be used as a light source. At least one area of each of the fingerprint sensor units FSU may overlap at least one pixel PXL, or at least one of the fingerprint sensor units FSU may be disposed in an area between adjacent pixels PXL.

Figure 8:
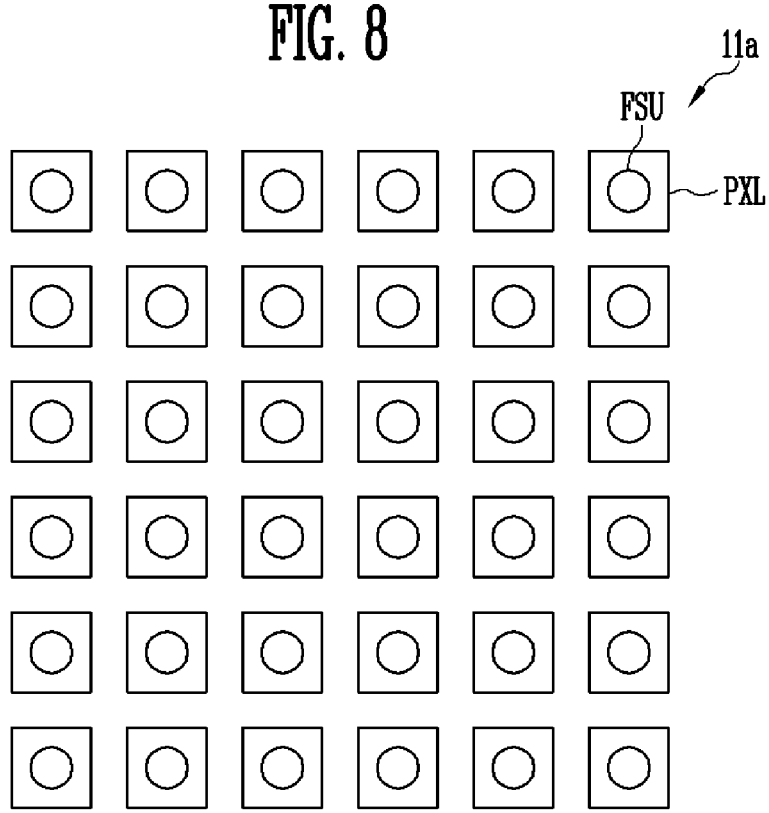
FIG. 8 illustrates a plan view of a fingerprint sensor area (or fingerprint sensing area) of a display device according to an embodiment.

Referring to FIG. 8, according to an embodiment, the fingerprint sensor units FSU may be disposed at the same resolution as the pixels PXL at least in the fingerprint sensor area 11a. In an embodiment, the fingerprint sensor unit 11a may include fingerprint sensor units FSU as many as the number of pixels PXL. According to an embodiment, at least one portion of each of the fingerprint sensor units FSU may overlap with at least one pixel PXL. For example, each of the fingerprint sensor units FSU may be disposed in an area in which one pixel PXL is formed.

Figure 9:
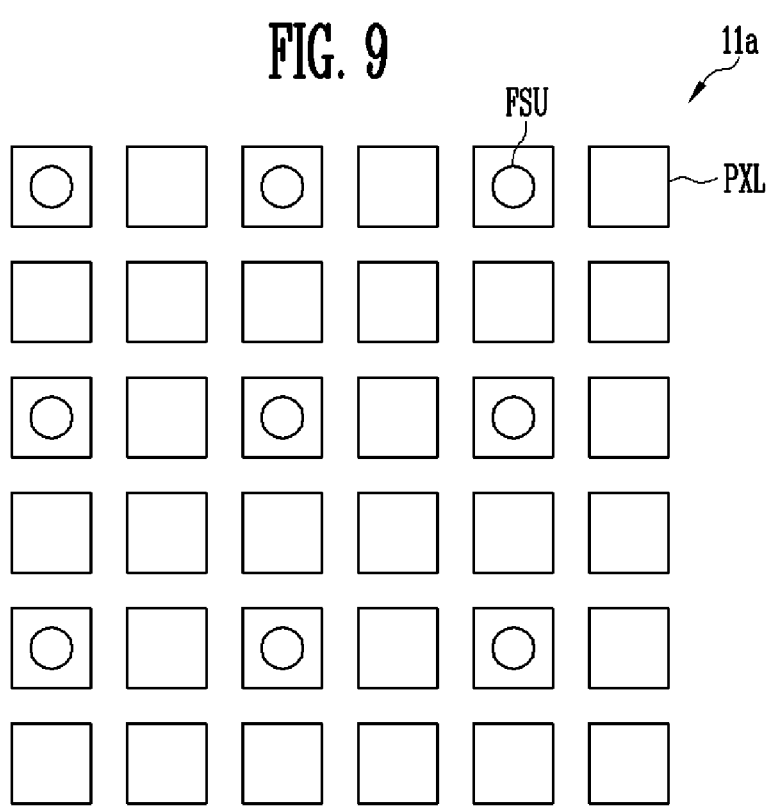
FIG. 9 illustrates a plan view of a fingerprint sensor area of a display device according to an embodiment.

Referring to FIG. 9, according to an embodiment, the fingerprint sensor units FSU may be arranged at a predetermined distance in the fingerprint sensor area 11a with a smaller number than that of the pixels PXL. For example, the fingerprint sensor units FSU may be disposed in an area in which a portion of the pixels PXL disposed in the fingerprint sensor area 11a is formed. FIG. 9 discloses an embodiment in which one fingerprint sensor unit FSU per four pixels PXL is disposed in the fingerprint sensor area 11a. The number or resolution of fingerprint sensor units FSU provided in the fingerprint sensor area 11a may be configured and/or optimized in particular embodiments.

Figure 10:
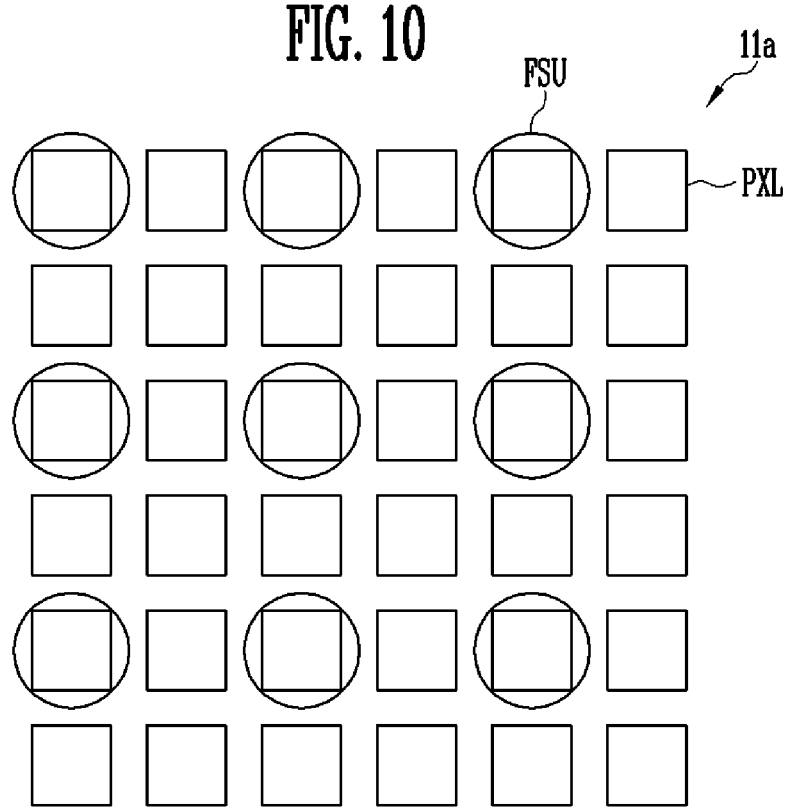
FIG. 10 illustrates a plan view of a fingerprint sensor area of a display device according to an embodiment.

Referring to FIG. 10, according to an embodiment, each of the fingerprint sensor units FSU may have a larger size than an individual pixel PXL and be arranged in an area including the pixel PXL corresponding to each of the fingerprint sensor units FSU.

Figure 11:
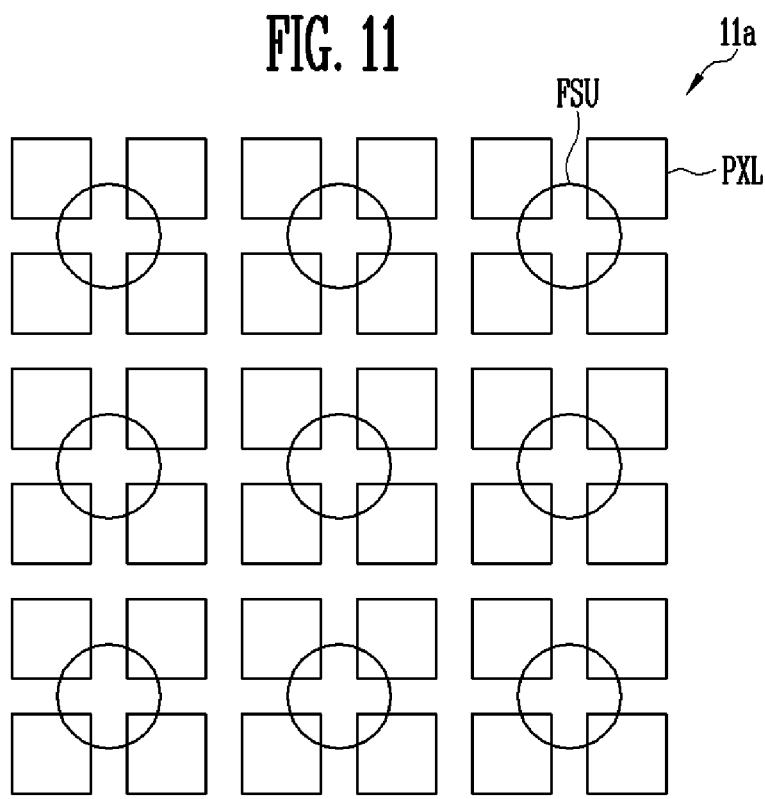
FIG. 11 illustrates a plan view of a fingerprint sensor area of a display device according to an embodiment.

Referring to FIG. 11, according to an embodiment, each of the fingerprint sensor units FSU may be disposed at boundaries between immediately neighboring pixels PXL. At least one area of each of the fingerprint sensor units FSU may overlap the immediately neighboring pixels PXL.

Figure 12:
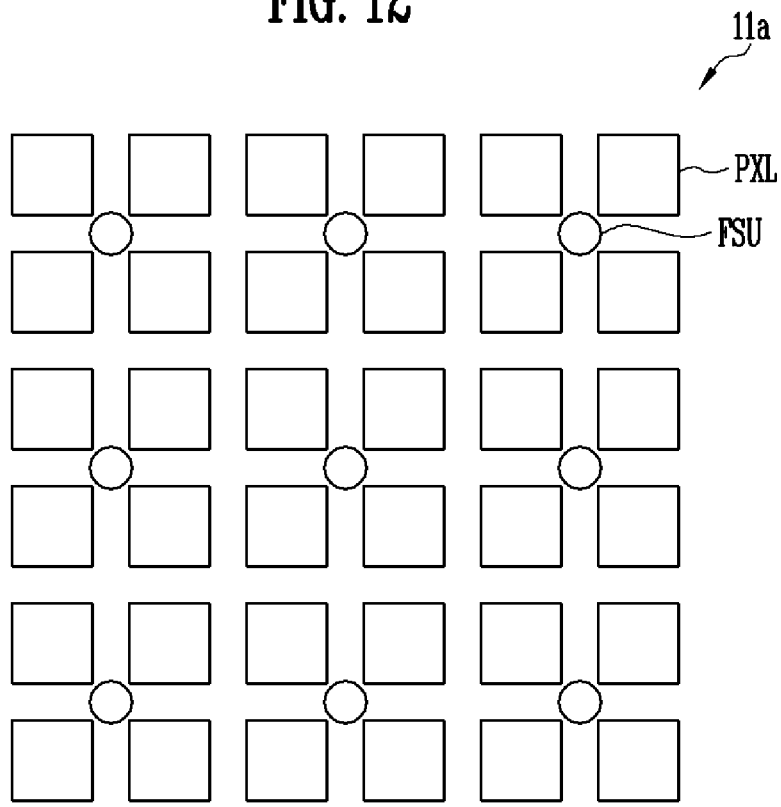
FIG. 12 illustrates a plan view of a fingerprint sensor area of a display device according to an embodiment.

Referring to FIG. 12, according to an embodiment, each of the fingerprint sensor units FSU may be disposed between immediately neighboring pixels PXL, but in a space between the pixels PXL so as not to overlap the pixels PXL.

As illustrated in FIGS. 8 to 12, the size, number, resolution, position and/or arrangement structure of the fingerprint sensor units FSU provided in the fingerprint sensor area 11a may be configured and/or optimized according to particular embodiments. For example, in consideration of various factors such as the amount of received light, the resolution and/or the cross-talk required by individual fingerprint sensor unit FSU for fingerprint sensing, the size, number, resolution, location and/or arrangement structure of the fingerprint sensor units FSU may be determined.

Figure 13:
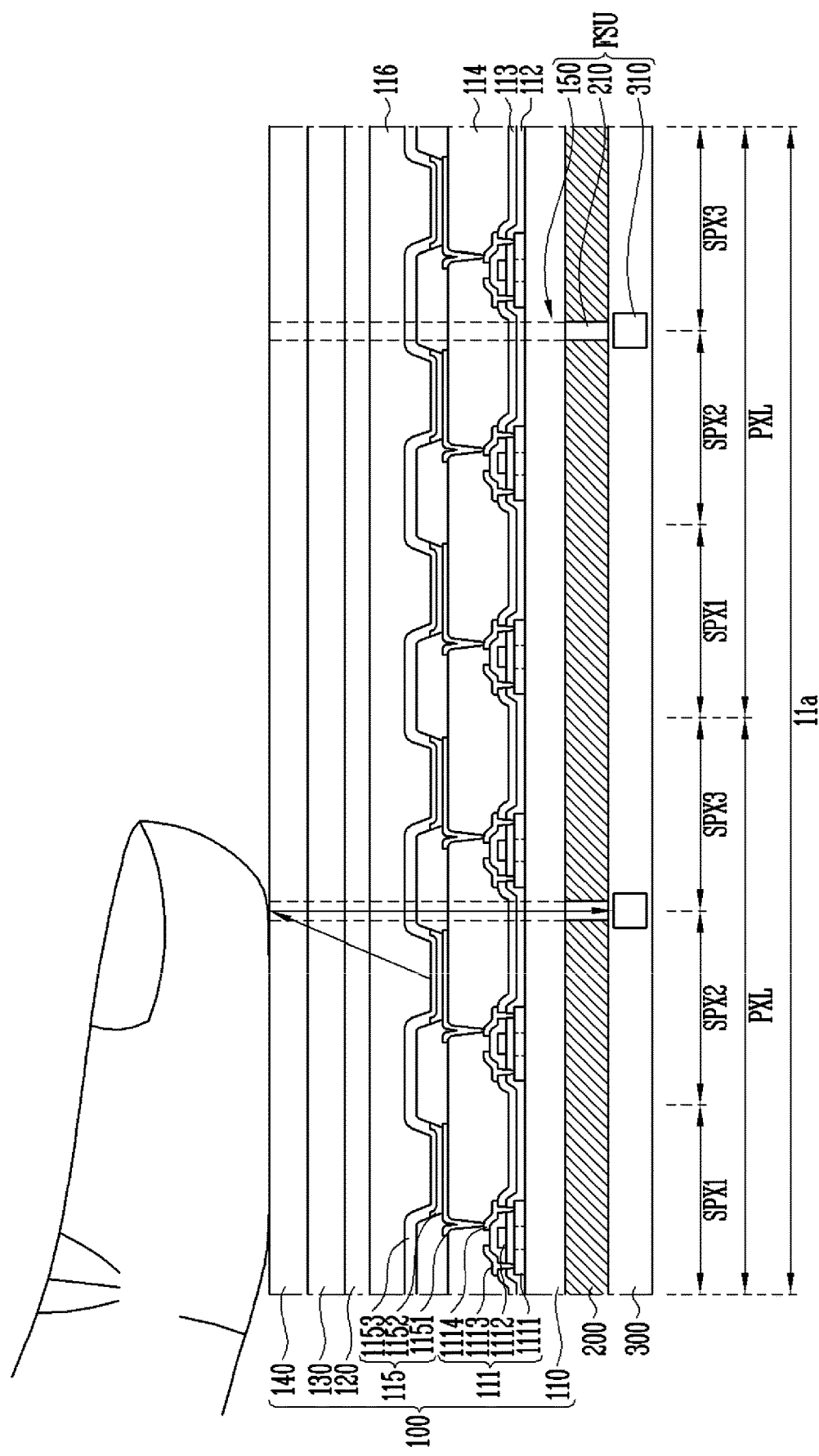
FIG. 13 is a cross-sectional view illustrating a fingerprint sensor area of a display device according to an embodiment.

FIG. 13 is a cross-sectional view illustrating a fingerprint sensor area of a display device according to an embodiment. FIG. 13 shows elements constituting sub-pixels. In FIG. 13, the sizes of the pixels are exaggerated compared to a size of a finger to clearly show each of the sub-pixels and the fingerprint sensor unit. However, actual sizes of the individual pixels and the fingerprint sensor units and a related pitch may be very small. In an embodiment, a plurality of pixels and fingerprint sensor units may be disposed under the fingerprint (or fingertip), and a fingerprint shape (a fingerprint pattern) may be detected/determined by synthesizing output signals from the fingerprint sensor units.

Referring to FIG. 13, the display device may include a plurality of fingerprint sensor units FSU disposed in the fingerprint sensor area 11a. Each fingerprint sensor unit FSU may include a light transmitting path 150, a light guide path 210, and a light receiving device 310 corresponding to one another. For example, each fingerprint sensor unit FSU may include at least one light transmitting path 150, at least one light guide path 210, and at least one light receiving device 310 arranged to overlap with one another, among a plurality of light transmitting paths 150, light guide paths 210, and light receiving devices 310. The fingerprint sensor unit FSU may use at least one light emitting device 115 included in a neighboring pixel PXL as a light source for fingerprint sensing. Therefore, in addition to the light transmitting paths 150, the light guide paths 210 and the light receiving devices 310 corresponding to one another, at least one light emitting device 115 provided in the neighboring pixel PXL may constitute each fingerprint sensor unit FSU.

The display device may include a first substrate 110 and/or a second substrate 120. For example, a display device may include a display panel 100 including the first and second substrates 110 and 120 and displaying an image on one surface (e.g., a front surface) of the second substrate 120, a light sensor layer 300 disposed on a rear surface (an opposite surface to one surface displaying an image) of the display panel 100, and a light guide layer 200 disposed between the display panel 100 and the light sensor layer 300.

The display panel 100 may include the first substrate 110 and the second substrate 120 on a first surface of the first substrate 110. In an embodiment, the first substrate 110 and the second substrate 120 may be opposed to each other. According to an embodiment, the display panel 100 may further include at least one of a polarizing plate 130 and a window 140 disposed on the second substrate 120.

According to an embodiment, at least one of the first substrate 110 and the second substrate 120 may be a glass substrate or a plastic substrate. For example, the first substrate 110 and/or the second substrate 120 may be a flexible substrate including at least one of polyethersulfone (PES), polyacrylate, polyetherimide (PEI), polyethylene naphthalate (PEN) polyethylene terephthalate (PET), polyphenylene sulfide (PPS), polyarylate (PAR), polyimide (PI), polycarbonate (PC), cellulose triacetate (TAC), and cellulose acetate propionate (CAP). In an embodiment, the first substrate 110 and/or the second substrate 120 may be a rigid substrate including one of glass and tempered glass. Further, the first substrate 110 and/or the second substrate 120 may be a transparent substrate, that is, a light transmitting substrate.

According to an embodiment, at least one of the first substrate 110 and the second substrate 120 may include an insulating layer having at least one inorganic film and/or organic film. For example, the second substrate 120 may be a thin film encapsulation (TFE) layer including at least one inorganic film and/or organic film.

According to an embodiment, the first substrate 110 may be provided with the plurality of pixels PXL. For example, the plurality of pixels PXL may be disposed between the first substrate 110 and the second substrate 120. According to an embodiment, each of the pixels PXL may include a plurality of sub-pixels, for example, the first, second and third sub-pixels SPX1, SPX2 and SPX3.

Each of the first, second and third sub-pixels SPX1, SPX2 and SPX3 may include a transistor 111 on the first surface of the first substrate 110 and the light emitting device 115 electrically connected to the transistor 111. According to an embodiment, the transistor 111 may include an active layer 1111, a gate electrode 1112, and source and drain electrodes 1113 and 1114. According to an embodiment, the active layer 1111 may be disposed on the first substrate 110, and the gate electrode 1112 may overlap the active layer 1111 with a first insulating layer 112 interposed between the layers 1111 and 1112. According to an embodiment, the source and drain electrodes 1113 and 1114 may be disposed on a second insulating layer 113 located on the gate electrode 1112 and connected to the active layer 1111 through a contact hole formed in the first and second insulating layers 112 and 113.

According to an embodiment, a third insulating layer 114 may be disposed on the source and drain electrodes 1113 and 1114, and the light emitting device 115 may be disposed on the third insulating layer 114. The light emitting device 115 may be electrically connected to the transistor 111 through a via hole formed in the third insulating layer 114.

The light emitting device 115 may include a first electrode 1151 and a second electrode 1153 overlapping each other in at least one area and a light emitting layer 1152 interposed between the first and second electrodes 1151 and 1153. According to an embodiment, the first electrode 1151 and the second electrode 1153 may be an anode electrode and a cathode electrode, respectively. Depending on a pixel structure, the first electrode 1151 electrically connected to the transistor 111 may be a cathode electrode. According to an embodiment, a fourth insulating layer 116 may be disposed between the light emitting device 115 and the second substrate 120.

According to an embodiment, the display panel 100 may include a plurality of light transmitting paths 150 disposed in a periphery of the light emitting devices 115 included in at least a portion of the pixels PXL. For example, the display panel 100 may include a plurality of light transmitting paths 150 overlapping the pixels PXL and positioned in a space between the second and third sub-pixels SPX2 and SPX3.

According to an embodiment, the light transmitting paths 150 may be disposed so as to be deviated from light emitting areas (for example, an area in which the light emitting layer 1152 is arranged) of the light emitting devices 115 disposed in a periphery of the light transmitting paths 150. For example, the light transmitting paths 150 may be disposed at positions where light emitted from the light emitting devices 115 in an oblique direction toward a fingertip of a user and vertically reflected from the fingerprint of the user is received. As described above, when the fingerprint is sensed by using the light irradiated in an oblique direction on the fingerprint of the user, light and shade of the fingerprint may become more distinct, and the fingerprint pattern may be more easily sensed.

According to an embodiment, when the pixels PXL emit light in a direction of the second substrate 120, the light transmitting paths 150 may extend in a direction in which at least a portion of light emitted from at least one neighboring pixel PXL is reflected. The portion of light is reflected from a fingerprint/fingertip of a user and is transmitted toward a light receiving device 310. For example, the light transmitting paths 150 may extend in a direction perpendicular to the face of the substrate 110 on which the pixels PXL are disposed so as to transmit the reflected light portion in the direction perpendicular to the face of the substrate 110. According to an embodiment, a longitudinal direction of the light transmitting paths 150 may not be parallel to the face of the substrate 110, and, for example, may be perpendicular to the face of the substrate 110.

According to an embodiment, the light transmitting paths 150 may be formed to selectively transmit only light in a predetermined direction for the light reflected from the fingerprint/fingertip of the user. For example, a vertical hole may be physically drilled into the display panel 100, and/or wires or other light shielding elements may not obstruct the light transmitting paths 150.

According to an embodiment, a transparent space in the active area 11 may be used as a light transmitting path 150, and the light guide layer 210 and a light receiving device 310 may be disposed under the light transmitting path 150 so as to overlap the light transmitting path 150. In an embodiment, a light transmitting paths 150 may be/include one or more portions formed of one or more transparent materials in the first and second substrates 110 and 120 and a second electrode 1153 of a light emitting device 115 for transmitting light in a direction intersecting the display panel 100. In an embodiment, a light transmitting path 150 may be/include a hole, opening, or transparent portion formed in the display panel 100 so that light may be transmitted, and the light transmitting path 150 may be located in a transparent space between light shielding wires and/or circuit devices provided in the active area 11 including the pixels PXL.

According to an embodiment, the light guide layer 200 and the light sensor layer 300 may be disposed on a rear surface of the display panel 100, that is, on the second surface of the first substrate 110. The light guide layer 200 and the light sensor layer 300 may include light guide paths 210 and light receiving devices 310 corresponding to the light transmitting paths 150 of the display panel 100. For example, the light guide paths 210 and the light receiving devices 310 may be disposed under the light transmitting paths 150.

According to an embodiment, when the pixels PXL emit light in a direction of the second substrate 120, the light guide paths 210 may extend in a direction in which light transmitting through the light transmitting paths 150 of the light reflected from the fingerprint/fingertip of the user and incident in the direction of the first substrate 110 is transmitted. For example, the light guide paths 210 may extend in the same direction as an extension direction of the light transmitting paths 150, for example, in a direction perpendicular to the display panel 100. In an embodiment, the longitudinal direction of the light guide paths 210 may be perpendicular to the face of the substrate 110 on which the pixels PXL are disposed. The light guide paths 210 may function as a filter for selectively transmitting only a portion of the reflected light corresponding to a predetermined direction. When the light guide paths 210 are used, the fingerprint sensor unit FSU may be formed without using an additional lens.

According to embodiments, the shape and the size (for example, a diameter, a cross-sectional area and/or a height) of the light guide paths 210 and the like may be configured and/or optimized. For example, various types of the light guide paths 210 may be formed in the light guide layer 200 in consideration of various factors such as the amount of received light and resolution required for each fingerprint sensor unit FSU.

According to an embodiment, the light receiving devices 310 may be a photo-responsive or photo-sensitive device. For example, the light receiving devices 310 may be one of a photodiode, a CMOS image sensor, and a CCD camera. The light receiving devices 310 may generate an output signal upon/after receiving the light transmitted through the light transmitting paths 150 and the light guide paths 210. The output signals generated from the light receiving devices 310 may be input to a driving circuit (not shown) and used to generate fingerprint information of a user. In an embodiment, the display device may sense a fingerprint pattern of a finger on the display panel 100 using the output signals from the light receiving devices 310.

According to an embodiment as described above, the fingerprint sensor of the display device may sense a fingerprint of a user using the light emitted from the pixels PXL without requiring an additional light source. In an embodiment, by selectively transmitting light using the light guide paths 210, the fingerprint sensor may not require an additional lens for forming an image corresponding to the fingerprint pattern. Accordingly, the thickness of the display device may be minimized, and the manufacturing cost of the display device may be minimized.

According to an embodiment, the light sensor layer 300 for sensing the light reflected from the fingerprint/fingertip of the user and the light guide layer 200 may be disposed on a rear surface of the display panel 100. Accordingly, the light sensor layer 300 may be prevented from interfering with images viewed by the user; therefore, satisfactory image quality of the display device may be attained.

Figure 14:
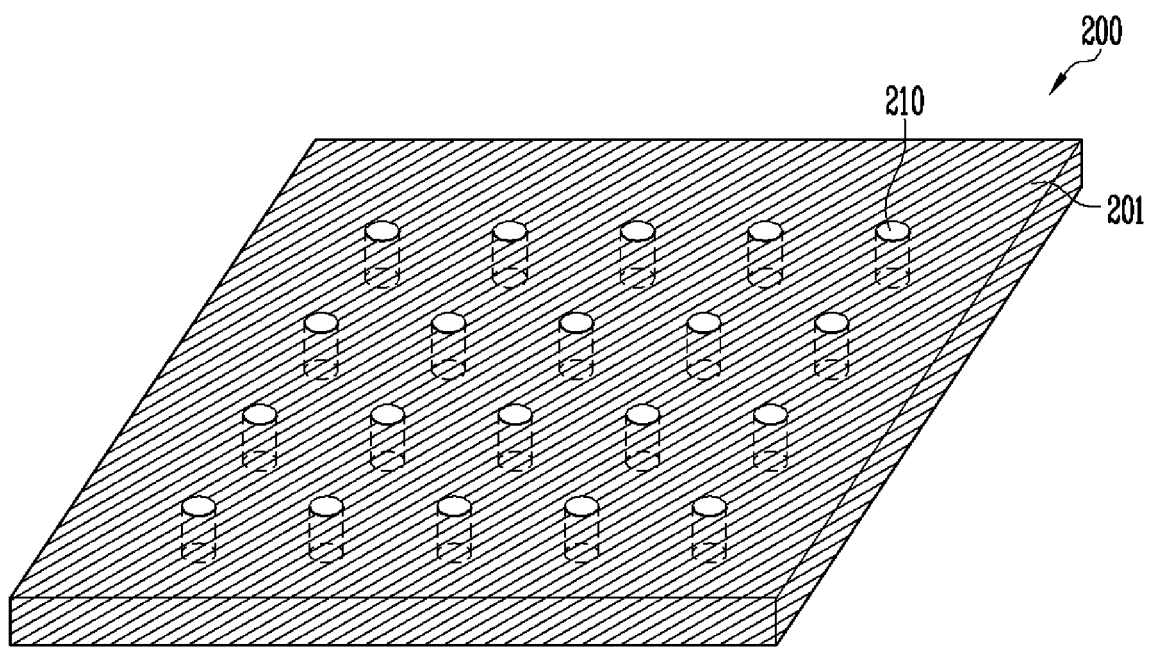
FIG. 14 illustrates a light guide layer shown in FIG. 13 according to an embodiment.

FIG. 14 illustrates an example of a light guide layer shown in FIG. 13.

Referring to FIG. 14, according to an embodiment, the light guide layer 200 may be a light shielding layer 201 including a plurality of openings corresponding to the light guide paths 210. In an embodiment, the light guide paths 210 may consist of openings or holes formed in the light shielding layer 201. According to an embodiment, the light shielding layer 201 may be a black matrix, and formed of a material having light shielding property. When the light guide layer 200 is provided by using the light shielding layer 201 including the plurality of openings, the fingerprint sensor unit FSU may be embodied without using a separate lens (an additional lens) and decrease in resolution due to diffraction of light may be prevented.

According to an embodiment, FIG. 14 illustrates the light guide paths 210 in a cylindrical shape. For example, the shape, size, and/or arrangement structure of the light guide paths 210 may be configured and/or optimized in embodiments.

Figure 15:
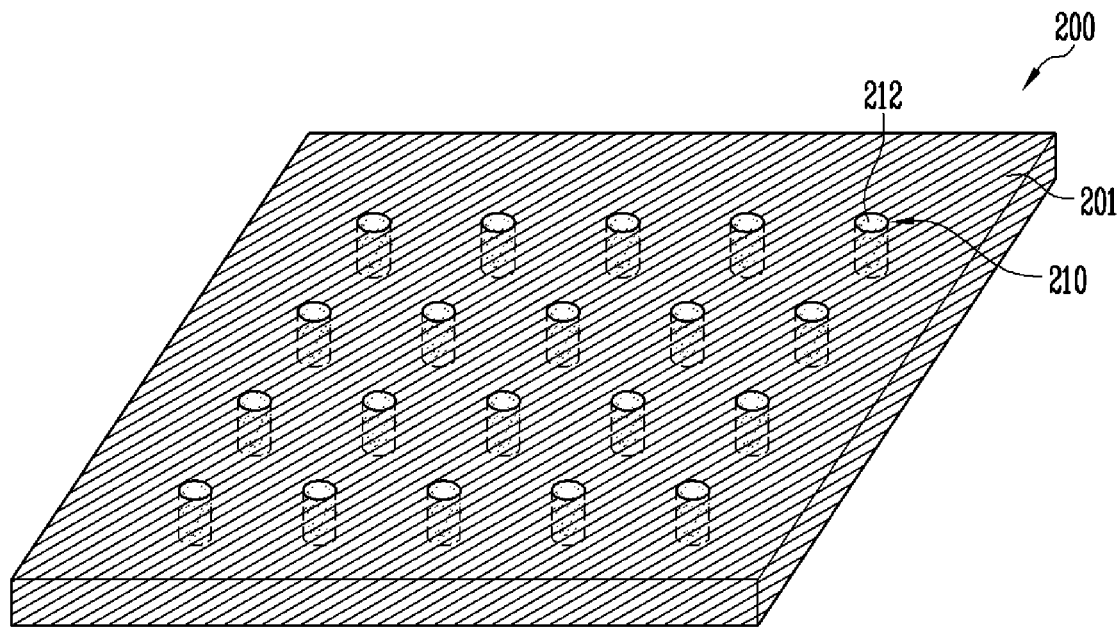
FIG. 15 illustrates a light guide layer shown in FIG. 13 according to an embodiment.

FIG. 15 illustrates an example of the light guide layer shown in FIG. 13. In FIG. 15, the similar or same elements as those in FIG. 14 are denoted by the same reference numerals.

Referring to FIG. 15, according to an embodiment, the light guide layer 200 may further include a color filter 212 filling the openings constituting the light guide paths 210. For example, when the pixels PXL disposed in the fingerprint sensor area 11a are driven to emit blue light and the blue light is used for fingerprint sensing, the color filter 212 may be a blue color filter that selectively transmits blue light. When the predetermined color filter 212 is included in the light guide paths 210, the light reflected from a finger may be more properly selected to improve reliability of the fingerprint sensing.

Figure 16:
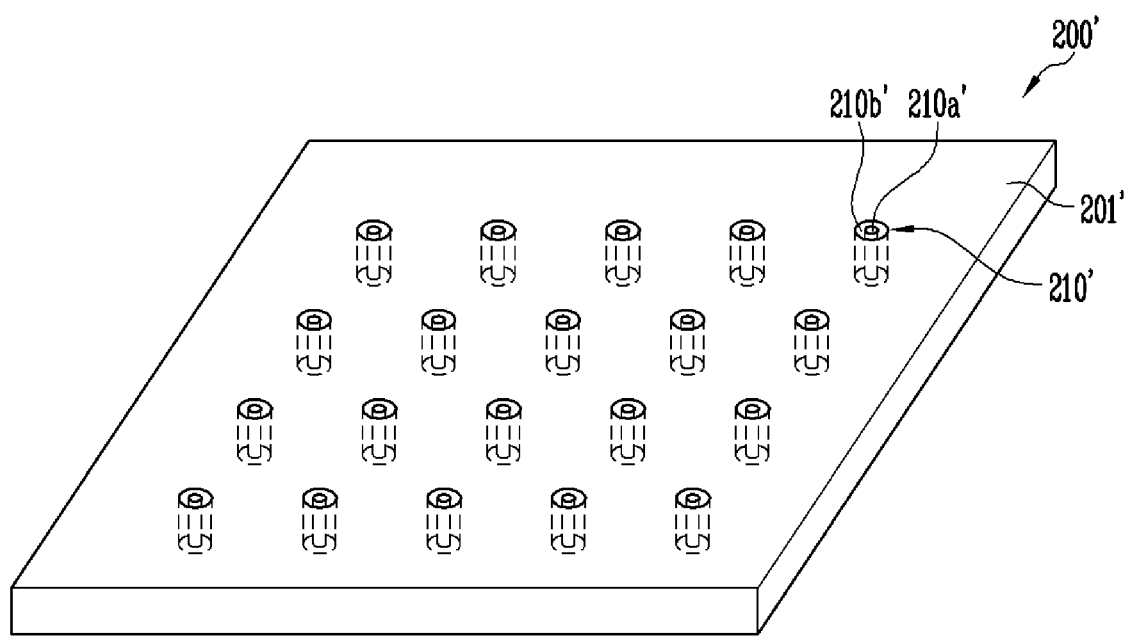
FIG. 16 illustrates a light guide layer shown in FIG. 13 according to an embodiment.

FIG. 16 illustrates an example of the light guide layer shown in FIG. 13.

Referring to FIG. 16, according to an embodiment, a light guide layer 200' may include optical fibers (a bundle of optical fibers) constituting light guide paths 210'. In an embodiment, each of the light guide paths 210' may be formed of an individual optical fiber including a core 210a' having a relatively high refractive index and a cladding 210b' surrounding the core 210a' and having a lower refractive index than the core 210a'. For example, the light guide layer 200' may be formed by cutting and disposing a bundle of optical fibers on the rear surface of the display panel 100 so as to correspond to the light transmitting paths 150. According to an embodiment, the light guide paths 210' may be embodied as other light guide path using a refractive index difference in addition to or instead of the optical fibers.

According to an embodiment, the light guide layer 200' may further include a transparent insulating layer 201' having a refractive index lower than that of the optical fibers constituting the light guide paths 210' and filling a space between the optical fibers. By using the transparent insulating layer 201', the optical fibers may be stably arranged at positions corresponding to the light-transmitting paths 150 and the light-receiving elements 310.

According to an embodiment, the light guide layer 200' may further include a color filter (not shown) included in a core 210a' of the optical fibers constituting each light guide path 210'. For example, a blue color filter material may be included in the core 210a'. The light reflected from a fingerprint may be more properly selected.

According to an embodiment as described above, the light guide paths 210' may be formed using optical fibers or an optical waveguide with a refractive index difference. Thus, light in a predetermined direction transmitted through the light transmitting paths 150, for example, light in a vertical direction, may be selectively incident on the light receiving devices 310.

Figure 17:
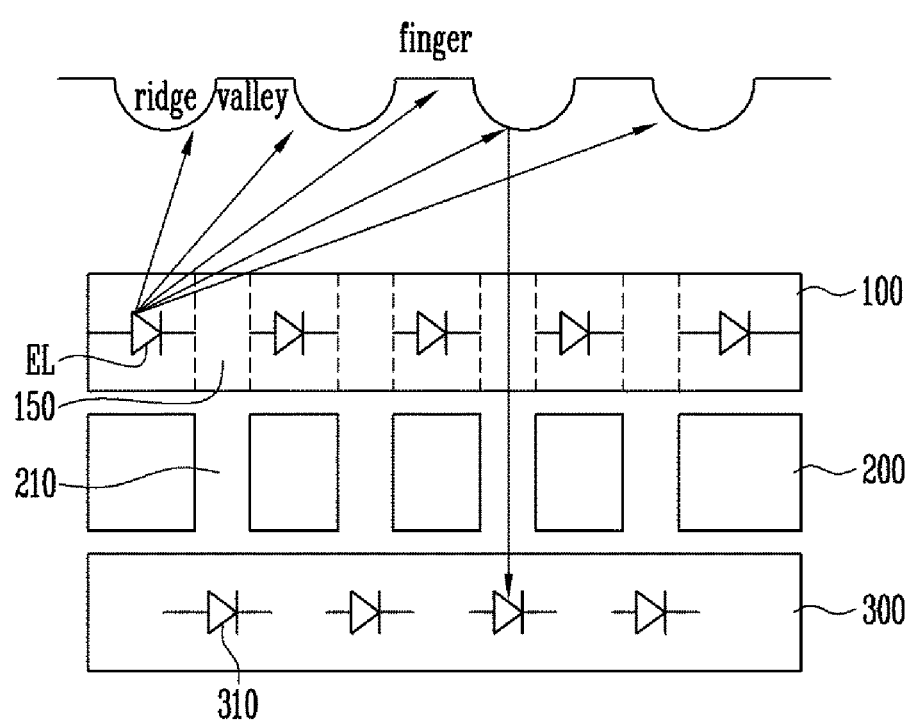
FIG. 17 illustrates a method of fingerprint sensing of a display device according to an embodiment.

FIG. 17 illustrates a method of fingerprint sensing of a display device according to an embodiment. In an embodiment, a photodiode is shown as an example of the light receiving device in FIG. 17.

Referring to FIG. 17, when the display device according to an embodiment is driven in the fingerprint sensing mode, at least a portion of the light emitting devices EL of the pixels included in the fingerprint sensor area 11a of the display panel 100 may be turned on. At least a portion of the light emitted from turned on light emitting element EL may be reflected by being hit by a finger of a user. Vertically reflected light transmitted through the light transmitting paths 150 and the light guiding path 200 in a corresponding area may be incident on (and received by) the light receiving device 310 (for example, a photodiode). In an embodiment, only the light reflected from the fingerprint/fingertip (which has ridges and valleys) and transmitted through at least one pair of the light transmitting path 150 and the light guide layer 200 may be selectively incident on the corresponding light receiving device 310.

The light receiving device 310 supplied with the reflected light may generate a corresponding output signal. The output signal of each of the light receiving devices 310 disposed in the light sensor layer 300 may be input to a driving circuit (not shown). The driving circuit may generate the fingerprint information of a user by collectively using the output signals of the light receiving devices 310. For example, ridges and valleys of the fingerprint/fingertip may be detected by integrating the output signals from the light receiving devices 310, and the shape of the fingerprint may be sensed/determined. Thus, the display device may provide a fingerprint sensing function.

The light transmitting paths 150 may be arranged so as not to overlap the light emitting areas of the light emitting devices EL. In an embodiment, the light emitting paths 150 may be disposed at positions where light emitted from the light emitting devices EL in an oblique direction toward the fingerprint/fingertip of the user and vertically reflected from the fingerprint of the user is received. According to the embodiment, in order to irradiate light on the fingerprint/fingertip of the user in an oblique direction, only a portion/subset of the pixels PXL arranged in the fingerprint sensor area 11a may be selectively turned on, and/or the pixels PXL in the fingerprint sensor area 11a may be divided into a plurality of groups and the pixels PXL included in respective group may be sequentially turned on. When light is irradiated on the fingerprint/fingertip of the user in an oblique direction, light and shade of the fingerprint may be more clearly recognized using the corresponding shade. Thus, the reliability of the fingerprint sensing may be optimized.

Figure 18:
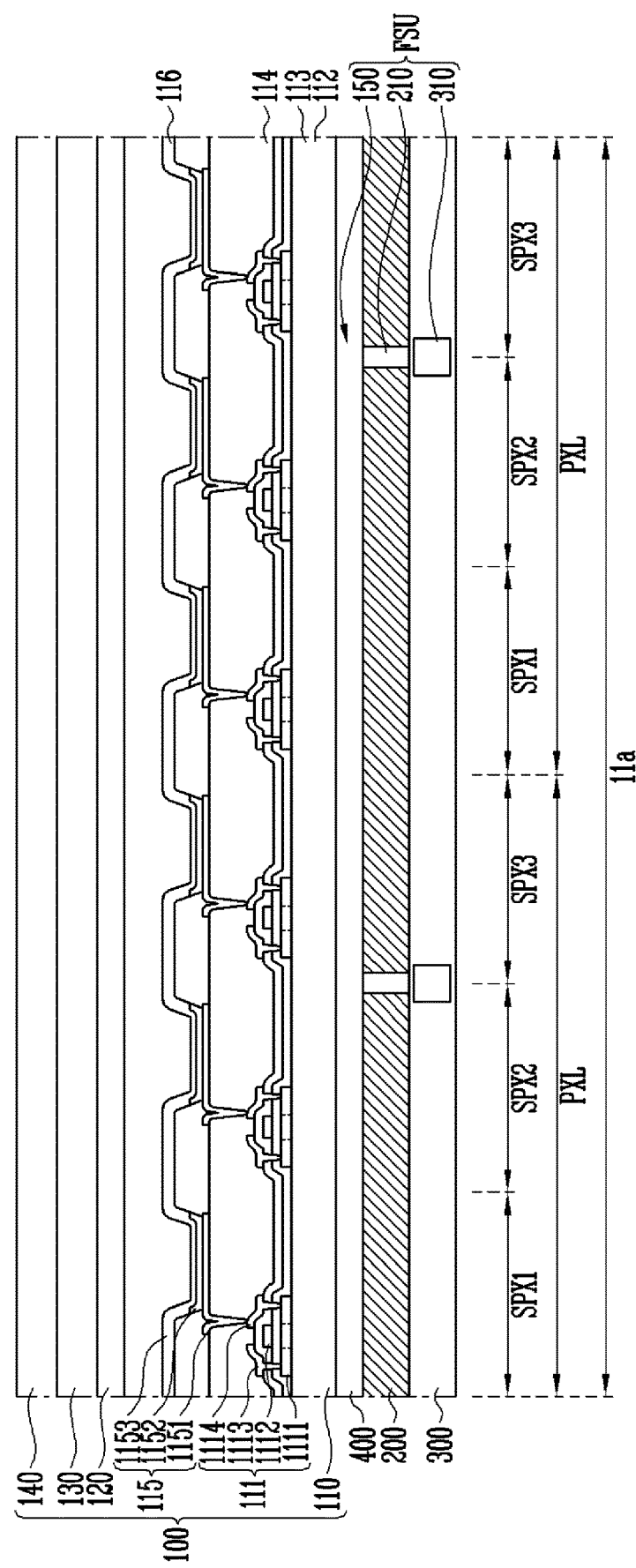
FIG. 18 is a cross-sectional view illustrating a fingerprint sensing area of a display device according to an embodiment.

FIG. 18 is a cross-sectional view illustrating a fingerprint sensing area of a display device according to an embodiment. In FIG. 18, the similar or same elements as in FIG. 13 are denoted by the same reference numerals, and a detailed description thereof will be omitted.

Referring to FIG. 18, the display device according to an embodiment may further include a filter layer 400 disposed between the display panel 100 and the light guide layer 200. According to an embodiment, the filter layer 400 may be a color filter that selectively transmits only the light emitted from a portion of the sub-pixels SPX1, SPX2 and SPX3. For example, when sub-pixels that emit blue light, among the sub-pixels SPX1, SPX2, and SPX3 are turned on for fingerprint sensing during a predetermined fingerprint sensing period, the filter layer 400 may be embodied as a blue color filter that selectively transmits the blue light. When the filter layer 400 is disposed between the display panel 100 and the light guide layer 200, the light reflected from a fingerprint and incident on the display panel 100 may be more properly selected.

Figure 19:
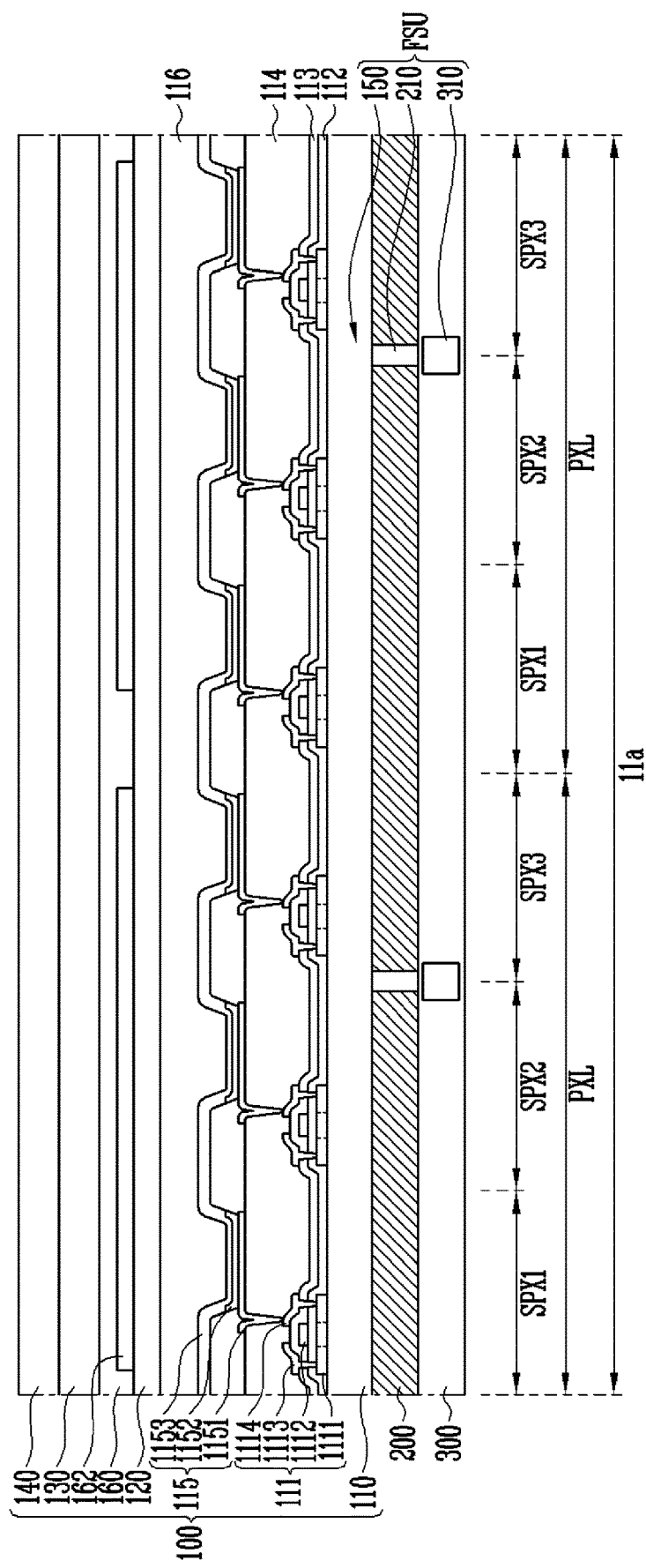
FIG. 19 is a cross-sectional view illustrating a fingerprint sensing area of a display device according to an embodiment.

FIG. 19 is a cross-sectional view illustrating a fingerprint sensing area of a display device according to an embodiment. In FIG. 19, the similar or same elements as in FIG. 13 are denoted by the same reference numerals.

Referring to FIG. 19, the display device according to an embodiment further includes a touch sensor layer 160 positioned in at least one area of the active area 11. According to an embodiment, the touch sensor layer 160 may include at least one touch sensor electrode 162 disposed in a predetermined fingerprint sensor area 11a in which the fingerprint sensor units FSU are provided of the active area 11. For example, the fingerprint sensor area 11a may be provided with a plurality of touch sensor electrodes 162 overlapping the pixels PXL and the fingerprint sensor units FSU.

According to an embodiment, the touch sensor layer 160 may be disposed on one surface of the second substrate 120, for example, on an upper surface of the second substrate. The position of the touch sensor layer 160 may be configured and/or optimized according to embodiments. For example, the touch sensor layer 160 may be disposed on an inner surface (e.g., a lower surface) and/or an outer surface (e.g., an upper surface) of the second substrate 120 and integrated with the display panel 100. In an embodiment, the touch sensor layer 160 may be separately formed from the display panel 100 and attached to at least one surface of the display panel 100. According to an embodiment, the touch sensor layer 160 may be a rigid or a flexible touch sensor layer 160 embodied on a rigid substrate or a flexible substrate.

According to an embodiment, the touch sensor layer 160 may be utilized for fingerprint sensing. For example, whether a finger is touched or not and/or where the finger is touched may be detected in response to the touch signal from the touch sensor layer 160, and the fingerprint sensing mode may be activated such that a fingerprint sensing period may be started.

According to an embodiment, an area in which the touch signal is generated may be set to the fingerprint sensor area 11a and the pixels PXL in the set fingerprint sensor area 11a may be driven in the fingerprint sensing mode. For example, in a display device in which fingerprint sensor units FSU are arranged at a predetermined resolution over the entire active area 11, a predetermined area including an area in which the touch signal is generated may be set to the fingerprint sensor area 11a in real time.

Further, according to an embodiment, the fingerprint sensor area 11a may be displayed by concurrently emitting light of a plurality of pixels PXL arranged in the area in which the touch signal is generated. In the case of the display device in which only a portion of the active area 11 is the fingerprint sensor area 11a or the touch sensor layer 160 is not provided, at least a portion of the pixels PXL of the fingerprint sensor area 11a may emit light in an initial period of the fingerprint sensing period even though the touch signal is not generated. As a result, the fingerprint sensor area 11a may be displayed, and the user may easily recognize the fingerprint sensor area 11a. According to an embodiment, the light of pixels PXL in a predetermined fingerprint sensor area 11a or the fingerprint sensor area 11a detected by the touch sensor layer 160 may be emitted to notify the user of the fingerprint sensor area 11a.

Various functions may be provided to the display device using the touch sensor layer 160 for fingerprint sensing.

FIG. 20 is a flowchart illustrating a driving/operating method of a display device according to an embodiment. Particularly, FIG. 20 is the flowchart illustrating a driving method of a display device using pixels as a light source for fingerprint sensing and including a light guide layer and a light sensor layer arranged on a display panel (for example, on a surface opposite an image-displaying surface of the display panel) in a fingerprint sensing period. In an embodiment, FIG. 21 illustrates an embodiment of a driving method of pixels in a fingerprint sensing area according to an embodiment. FIG. 21 shows an embodiment of a driving method of pixels in a fingerprint sensor area for a fingerprint sensing period.

Referring to FIG. 20, a method of driving/operating a display device may include step ST10 for activating a fingerprint sensing mode, step ST20 for turning on a pixel PXL in the fingerprint sensor area 11a, step ST30 for receiving light reflected from a fingertip and/or a fingerprint, and step ST40 for generating fingerprint information.

According to an embodiment, step ST10 may include activating the fingerprint sensing mode in response to a control signal, such that a fingerprint sending period may be started. According to an embodiment, the control signal may be generated according to the decision of a user. In an embodiment, the control signal may be supplied from a system for controlling the display device in accordance with contents related to images to be displayed by the display device.

For example, the user may input a touch signal for activating the fingerprint sensing mode through the touch sensor layer 160 shown in FIG. 19. The control signal for activating the fingerprint sensing mode corresponding to the touch signal by the user may be generated.

According to an embodiment, the area in which the touch is provided may be set as the fingerprint sensor area 11a. For example, a predetermined range from a point where the touch is provided may be set to the fingerprint sensor area 11a in real time.

According to an embodiment, the fingerprint sensor area 11a set according to the touch signal may be displayed by simultaneously turning on at least a portion of the pixels PXL in the area in which the touch signal is generated. Accordingly, the user may easily detect or recognize the fingerprint sensor area 11a and touch the corresponding area for fingerprint sensing.

According to an embodiment, regardless of whether the touch signal is generated or not, at the beginning of the fingerprint sensing period during which the fingerprint sensing mode is activated, at least a portion of the pixels PXL arranged in the predetermined fingerprint sensor area 11a may be concurrently turned on, the finger sensor area 11a may be displayed accordingly.

According an embodiment, step ST20 may include turning on at least a portion of the pixels PXL located in the fingerprint sensor area 11a at a predetermined distance and/or in a predetermined order.

For example, at step ST20, the pixels PXL located in the fingerprint sensor area 11a, as in the embodiment shown in FIG. 21, may be divided into a plurality of groups GR (e.g., 4 groups GR), and the pixels PXL included in each group GR may sequentially emit light. Corresponding pixels PXL belong to different groups GR and located at corresponding locations may emit light simultaneously or may be turned off simultaneously.

According to an embodiment, at ST20, the fingerprint sensing period during which the fingerprint sensing mode is activated may be divided into a plurality of sub-periods, only a subset of the pixels PXL arranged at one or more predetermined distances/positions (in each group GR) may selectively emit light during each sub-period.

According to an embodiment, in terms of driving the pixels PXL in the fingerprint sensing mode, the emission of the pixels PXL may be individually controlled using a scan signal, a light emitting control signal and/or a data signal described with reference to FIGS. 6 and 7. For example, the pixels PXL of the fingerprint sensor area 11a may selectively emit light in response to the control signal corresponding to the fingerprint sensing mode. According to an embodiment, the pixels PXL of the fingerprint sensor area 11a may be divided into a plurality of groups GR, and the pixels PXL included in each group GR may sequentially emit light in response to the control signal corresponding to the fingerprint sensing mode.

As in the embodiment shown in FIG. 21, at least a portion/subset of the pixels PXL located in the fingerprint sensor area 11a may be lit up at a predetermined distance (or location) and/or in a predetermined order, potential crosstalk that may occur between turned on pixels PXL may be minimized or reduced. Thus, the reliability of the fingerprint sensing may be improved.

According to an embodiment, step ST30 may include receiving the light on the light sensor layer 300, wherein the light has been reflected from the finger and/or the fingerprint of the user and has been transmitted via the light guide layer 200. For example, at step ST30, light reflected from a fingerprint may be transmitted through the light transmitting paths 150 and the light guide paths 210 of the light guide layer 200 of the display panel 100 and may be incident on (and received by) the light receiving devices 310 of the light sensor layer 300. The light receiving devices 310 may generate one or more output signals corresponding to the received light.

According to an embodiment, step ST40 may include generating fingerprint information of the user using the output signals from the light receiving devices 310. For example, characteristics of the fingerprint may be determined by integrating the output signals from the light receiving devices 310.

According to an embodiment, step ST40 may include sensing the fingerprint sensor area 11a, detecting the output signals output from the light receiving devices 310 arranged in the fingerprint sensor area 11a, selecting all of the output signals or a subset of the output signals, and generating the fingerprint information by synthesizing the selected output signals. According to an embodiment, sensing the fingerprint sensor area 11a may include sensing or detecting a predetermined fingerprint sensor area 11a, or setting a new fingerprint sensor area 11a. For example, a predetermined fingerprint sensor area 11a may be detected using stored area information, or an area in which a touch signal is generated (e.g., an area within a predetermined range relative to a touch) may be set to the fingerprint sensor area 11a.

According to an embodiment, the generating of the fingerprint information may be performed in a fingerprint sensor controller (or a fingerprint sensor driver) provided on a driving circuit (not shown) or an integrating controller integrated with a touch sensor controller (or, a touch sensor driver).

According to an embodiment, the sensed fingerprint information may be utilized for various purposes such as identifying a user or registering a new user. For example, a user may be identified by comparing the fingerprint information of a specific user stored in advance with the fingerprint information sensed through the fingerprint sensor.

According to an embodiment, a display device may include a fingerprint sensor for sensing a fingerprint of a user using light emitted from pixels without using an additional light source. Accordingly, the display device may have a minimized thickness and/or the related manufacturing cost may be minimized.

According to an embodiment, a light sensor layer for sensing light reflected from a fingerprint of a user may be disposed on a rear surface of a display panel. Accordingly, the light sensor layer may not interfere with images viewed by a user, so that satisfactory image quality of the display device may be attained.

While embodiments have been described as examples, various modifications may be made without departing from the scope defined by the claims.

What is claimed is:

1. A display device, comprising:
a first substrate, which includes light transmitting portions;

a plurality of pixels positioned on the first substrate and including light emitting devices;

a light sensor layer overlapping the first substrate and including a plurality of light receiving devices, the light receiving devices respectively corresponding to the light transmitting portions and configured to output one or more output signals in response to received light; and a light guide layer including a material layer and a plurality of light guide paths, the material layer including a plurality of through holes and being positioned between the light sensor layer and the plurality of pixels, the light guide paths respectively corresponding to the light transmitting portions and being respectively positioned in the through holes, wherein the light guide paths include a first light guide path, which includes a first cladding and a first core surrounded by the first cladding, wherein the light guide layer includes an insulating portion surrounding the first cladding, wherein a refractive index of the first core is greater than a refractive index of the first cladding and the refractive index of the first cladding is greater than a refractive index of the insulating portion.

2. The display device of claim 1, wherein the first substrate is positioned between the plurality of pixels and the light sensor layer.

3. The display device of claim 1, comprising: a second substrate, which overlaps the first substrate and includes light transmitting parts, wherein the light transmitting parts respectively correspond to the light transmitting portions, and wherein the pixels are configured to emit light toward the second substrate and are positioned between the first substrate and the second substrate.

4. The display device of claim 1, wherein each of a longitudinal direction of each of the light transmitting portions, a longitudinal direction of each of the through holes, and a longitudinal direction of each of the light guide paths is perpendicular to a face of the first substrate on which the plurality of pixels is arranged.

5. The display device of claim 1, comprising: a plurality of fingerprint sensor units including a first fingerprint sensor unit, the first fingerprint sensor unit including a first light transmitting portion among the light transmitting portions, a first light receiving device among the light receiving devices, and a first light guide path among the light guide paths, wherein the first light transmitting portion, the first light receiving device, and the first light guide path correspond to one another.

6. The display device of claim 5, wherein the pixels include a first pixel, wherein the first pixel comprises two subpixels immediately neighboring each other, wherein a geometric axis of the first light guide path coincides with a boundary between the two subpixels.

7. The display device of claim 5, wherein, in a predetermined portion of the display device, a total quantity of the fingerprint sensors is equal to a total quantity of the pixels or is equal to a fraction of the total quantity of the pixels.

8. The display device of claim 5, wherein the first fingerprint sensor unit overlaps at least one of the pixels.

9. The display device of claim 5, wherein the pixels include a first pixel, wherein the first pixel comprises two subpixels immediately neighboring each other, wherein the first light receiving device is positioned at a boundary between the two subpixels.

10. The display device of claim 1, wherein the light guide paths include a first light guide path, wherein the pixels include a first pixel, wherein the first pixel comprises a first subpixel and a second subpixel immediately neighboring each other, wherein the first light guide path is positioned between a light emitting device of the first subpixel and a transistor of the second subpixel.

11. The display device of claim 10, wherein the first light guide path is positioned between a first electrode of the light emitting device of the first pixel and an active layer of the transistor of the second pixel.

12. The display device of claim 1, wherein the light guide paths are openings or transparent portions, and wherein the material layer includes light shielding portions positioned between the light guide paths.

13. The display device of claim 1, wherein the light guide paths include color filters, and wherein the material layer further includes light shielding portions positioned between the color filters.

14. The display device of claim 1, further comprising: a color filter layer positioned between the first substrate and the light guide layer.

15. The display device of claim 14, wherein each of the pixels includes a plurality of sub-pixels emitting light in different colors, wherein the different colors include a first color, and wherein the color filter layer has the first color.

16. The display device of claim 1, wherein the light guide paths include a first light guide path, wherein the pixels include a first pixel, wherein the first pixel comprises a first subpixel and a second subpixel immediately neighboring each other, wherein the first light guide path is positioned between a light emitting device of the first subpixel and a light emitting device of the second subpixel.

17. The display device of claim 1, further comprising: a touch sensor layer, which comprises touch sensor electrodes, the touch sensor electrodes respectively overlapping the pixels and respectively overlapping the light guide paths.

18. The display device of claim 17, wherein the touch sensor electrodes include a first touch sensor electrode, wherein the light guide paths include a first light guide path overlapping the first touch sensor electrode and positioned between a first edge of the fist touch sensor electrode and a second edge of the first touch sensor electrode, and wherein a minimum distance between the first edge of the first touch sensor electrode and the first light guide path is greater than a minimum distance between the second edge of the first touch electrode and the first light guide path.

19. The display device of claim 1, wherein a first subset of the pixels is configured to emit light in response to a control signal to indicate a fingerprint sensing area when a second subset of the pixels emits no light.

20. The display device of claim 1, wherein the pixels form a plurality of pixel groups, and wherein pixels included in one of the pixel groups are configured to sequentially emit light in response to a control signal.

21. A method of operating a display device, the display device comprising a first substrate, a plurality of pixels positioned on the first substrate and having light emitting devices, a light sensor layer overlapping the first substrate, and a light guide layer positioned between the first substrate and the light sensor layer, the method comprising:

starting a fingerprint sensing period in response to a control signal;

turning on a first subset of the pixels during the fingerprint sensing period to emit first light toward at least one of a finger and a fingerprint;

receiving second light using the light sensor layer, wherein the second light is a portion of the first light that is reflected from the at least one of the finger and the fingerprint and is transmitted via the light guide layer;

generating an output signal corresponding to the second light;

generating fingerprint information using the output signal; and turning off or keeping off a second subset of the pixels when the first subset of the pixels is on, wherein turned-off non-light-emitting pixels of the second subset are positioned between turned-on light-emitting pixels of the first subset and separate the turned-on light-emitting pixels of the first subset from one another.

22. The method of claim 21, wherein the fingerprint sensing period includes a first sub-period and a second sub-period immediately following the first sub-period, wherein the first subset of the pixels emits the first light in the first sub-period, wherein a second subset of the pixels emits no light in the first sub-period, wherein the first subset of the pixels emits no light in the second sub-period, and wherein the second subset of the pixels emits third light in the second sub-period.

23. The method of claim 21, comprising: generating the control signal in response to a touch provided by the finger on the display device.

24. The method of claim 23, comprising:
setting a fingerprint sensing area based on a location of the touch; and
selecting the first subset of the pixels based on the fingerprint sensing area.

25. The method of claim 24, comprising: indicating, in response to the touch, the fingerprint sensing area by concurrently turning on at least pixels that are located in an area of the display device corresponding to the touch.

26. The method of claim 21, comprising: indicating a fingerprint sensing area by concurrently turning on the first subset of the pixels for a predetermined initial period of the fingerprint sensing period, wherein the first subset of the pixels is located in the fingerprint sensing area.

27. A method of operating a display device, the display device comprising a first substrate, a plurality of pixels positioned on the first substrate and having light emitting devices, a light sensor layer overlapping the first substrate, and a light guide layer positioned between the first substrate and the light sensor layer, the method comprising:

in response to a touch by a finger of a user, concurrently turning on selective pixels among the pixels to concurrently emit indicator light to indicate a fingerprint sensing area to the user;

starting a fingerprint sensing period in response to a control signal;

turning on a first subset of the pixels during the fingerprint sensing period to emit first light toward at least one of the finger and a fingerprint associated with the finger;

receiving second light using the light sensor layer, wherein the second light is a portion of the first light that is reflected from the at least one of the finger and the fingerprint and is transmitted via the light guide layer;

generating an output signal corresponding to the second light; and generating fingerprint information using the output signal.

* * * * *